United States Patent
Lee et al.

(10) Patent No.: US 10,453,857 B2
(45) Date of Patent: Oct. 22, 2019

(54) THREE-DIMENSIONAL SEMICONDUCTOR DEVICE

(71) Applicant: SAMSUNG ELECTRONICS CO., LTD., Suwon-si, Gyeonggi-do (KR)

(72) Inventors: Jung Hwan Lee, Seoul (KR); Jee Yong Kim, Hwaseong-si (KR); Seok Jung Yun, Iksan-si (KR); Ji Hyeon Lee, Suncheon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/928,559

(22) Filed: Mar. 22, 2018

(65) Prior Publication Data

US 2019/0043880 A1 Feb. 7, 2019

(30) Foreign Application Priority Data

Aug. 1, 2017 (KR) .................. 10-2017-0097636

(51) Int. Cl.
| | |
|---|---|
| *H01L 27/115* | (2017.01) |
| *H01L 27/11582* | (2017.01) |
| *H01L 27/1157* | (2017.01) |
| *H01L 27/11565* | (2017.01) |
| *H01L 21/768* | (2006.01) |
| *H01L 23/522* | (2006.01) |
| *H01L 23/528* | (2006.01) |

(52) U.S. Cl.
CPC .. *H01L 27/11582* (2013.01); *H01L 21/76816* (2013.01); *H01L 21/76877* (2013.01); *H01L 23/528* (2013.01); *H01L 23/5227* (2013.01); *H01L 27/1157* (2013.01); *H01L 27/11565* (2013.01)

(58) Field of Classification Search
CPC .................. H01L 27/11578; H01L 23/5283
See application file for complete search history.

(56) References Cited

U.S. PATENT DOCUMENTS

| | | | |
|---|---|---|---|
| 8,648,404 B2 | 2/2014 | Ko et al. | |
| 8,759,162 B2 | 6/2014 | Wada et al. | |
| 9,214,569 B2 | 12/2015 | Kim et al. | |
| 9,431,336 B2 | 8/2016 | Lim | |
| 9,508,645 B1 * | 11/2016 | Lin | H01L 23/522 |
| 9,685,408 B1 * | 6/2017 | Jiang | H01L 27/11548 |
| 10,141,372 B2 * | 11/2018 | Park | H01L 27/0688 |
| 10,186,452 B2 * | 1/2019 | Chang | H01L 21/76816 |
| 2010/0213526 A1 | 8/2010 | Wada et al. | |

(Continued)

OTHER PUBLICATIONS

Singapore Search Report & Written Opinion dated Oct. 2, 2018 by the Singapore Intellectual Property Office, Singapore patent Application No. 10201805426Y.

*Primary Examiner* — George R Fourson, III
(74) *Attorney, Agent, or Firm* — Lee & Morse, P.C.

(57) ABSTRACT

A three-dimensional semiconductor device includes gate electrodes including pad regions sequentially lowered by a first step portion in a first direction and sequentially lowered by a second step portion in a second direction perpendicular to the first direction, the second step portion being lower than the first step portion, wherein a length of a single pad region among pad regions sequentially lowered by the second step portion in the second direction is less than a length of a remainder of the pad regions in the second direction.

20 Claims, 28 Drawing Sheets

(56) References Cited

U.S. PATENT DOCUMENTS

| | | |
|---|---|---|
| 2012/0061744 A1 | 3/2012 | Hwang et al. |
| 2012/0319173 A1 | 12/2012 | Ko et al. |
| 2013/0009274 A1* | 1/2013 | Lee .................. H01L 27/11582 257/499 |
| 2013/0043509 A1 | 2/2013 | Cho et al. |
| 2013/0056818 A1* | 3/2013 | Iino .................... H01L 27/1157 257/324 |
| 2015/0001613 A1* | 1/2015 | Yip ...................... H01L 27/115 257/329 |
| 2015/0179564 A1 | 6/2015 | Lee et al. |
| 2015/0287710 A1 | 10/2015 | Yun et al. |
| 2016/0211209 A1* | 7/2016 | Wu ..................... H01L 29/0657 |
| 2016/0268287 A1 | 9/2016 | Park et al. |
| 2016/0322376 A1 | 11/2016 | Lee |
| 2016/0322381 A1* | 11/2016 | Liu ................... H01L 27/11573 |
| 2017/0103992 A1* | 4/2017 | Hachisuga ........ H01L 27/11582 |
| 2017/0200676 A1* | 7/2017 | Jeong ................ H01L 27/11524 |
| 2017/0207220 A1* | 7/2017 | Yun .................... H01L 27/1052 |
| 2017/0294383 A1* | 10/2017 | Tanzawa ........... H01L 27/11582 |
| 2017/0352586 A1* | 12/2017 | Venkatasubramanian ................... H01L 27/11556 |
| 2018/0082940 A1* | 3/2018 | Sorensen ............. H01L 23/528 |
| 2018/0090512 A1* | 3/2018 | Kim ................. H01L 27/11575 |
| 2018/0197874 A1* | 7/2018 | Oshiki .............. H01L 27/11565 |

\* cited by examiner

THREE-DIMENSIONAL SEMICONDUCTOR DEVICE

CROSS-REFERENCE TO RELATED APPLICATION

Korean Patent Application No. 10-2017-0097636, filed on Aug. 1, 2017, in the Korean Intellectual Property Office, and entitled: "Three-Dimensional Semiconductor Device," is incorporated by reference herein in its entirety.

BACKGROUND

1. Field

The present disclosure relates to a semiconductor device, and in detail, to a three-dimensional semiconductor device including pad regions arrayed in three dimensions.

2. Description of the Related Art

Semiconductor devices including gate electrodes stacked in a direction perpendicular to a surface of a semiconductor substrate have been developed. Such gate electrodes may include pad regions arrayed to have a stepped shape lowered in a single direction. As the number of gate electrodes stacked on a semiconductor substrate gradually increases, allowing for high degrees of integration to be realized therein, the size of a plane on which pad regions arrayed to have a stepped shape lowered in a single direction are disposed has gradually increased. Thus, there are limitations in the realization of high degrees of integration in semiconductor devices.

SUMMARY

According to an aspect of the present disclosure, a three-dimensional semiconductor device is provided. The semiconductor device includes gate electrodes including pad regions sequentially lowered by a first step portion in a first direction and sequentially lowered by a second step portion, lower than the first step portion, in a second direction, perpendicular to the first direction. Among pad regions lowered by the second step portion in the second direction, a single pad region has a length less than that of the remainder of pad regions in the second direction.

According to an aspect of the present disclosure, a three-dimensional semiconductor device is provided. The semiconductor device includes a first main separation structure and a second main separation structure, disposed in a memory cell array region and a connection region of a substrate, and gate electrodes stacked on the memory cell array region in a direction perpendicular to a surface of the substrate and extended to the connection region. The gate electrodes are disposed between the first main separation structure and the second main separation structure, the gate electrodes include a single lower gate electrode or a plurality of lower gate electrodes, intermediate gate electrodes on the lower gate electrodes, and a single upper gate electrode or a plurality of upper gate electrodes on the intermediate gate electrodes, the intermediate gate electrodes include intermediate pad regions sequentially lowered by a first step portion in a first direction of the connection region in the memory cell array region and sequentially lowered by a second step portion, lower than the first step portion, in a second direction from the first main separation structure to the second main separation structure, and a single pad region among pad regions sequentially lowered by the second step portion in the second direction has a length different from that of a remainder of pad regions in the second direction.

According to an aspect of the present disclosure, a three-dimensional semiconductor device is provided. The semiconductor device includes lower gate electrodes and intermediate gate electrodes on the lower gate electrodes. The intermediate gate electrodes include intermediate pad regions lowered by a first step portion in a first direction and lowered by a second step portion, lower than the first step portion, in a second direction, perpendicular to the first direction. The lower gate electrodes include lower pad regions lowered by the second step portion in the first direction.

According to an aspect of the present disclosure, a three-dimensional semiconductor device is provided. The semiconductor device includes a first main separation structure and a second main separation structure, disposed on a substrate and extended in a first direction parallel to a surface of the substrate, and gate electrodes disposed between the first main separation structure and the second main separation structure. The gate electrodes include pad regions lowered by a first step portion in the first direction and sequentially lowered by a second step portion, lower than the first step portion, in a second direction from the first main separation structure to the second main separation structure. A single pad region among pad regions lowered by the second step portion in the second direction has a length less than that of the remainder of pad regions in the second direction.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
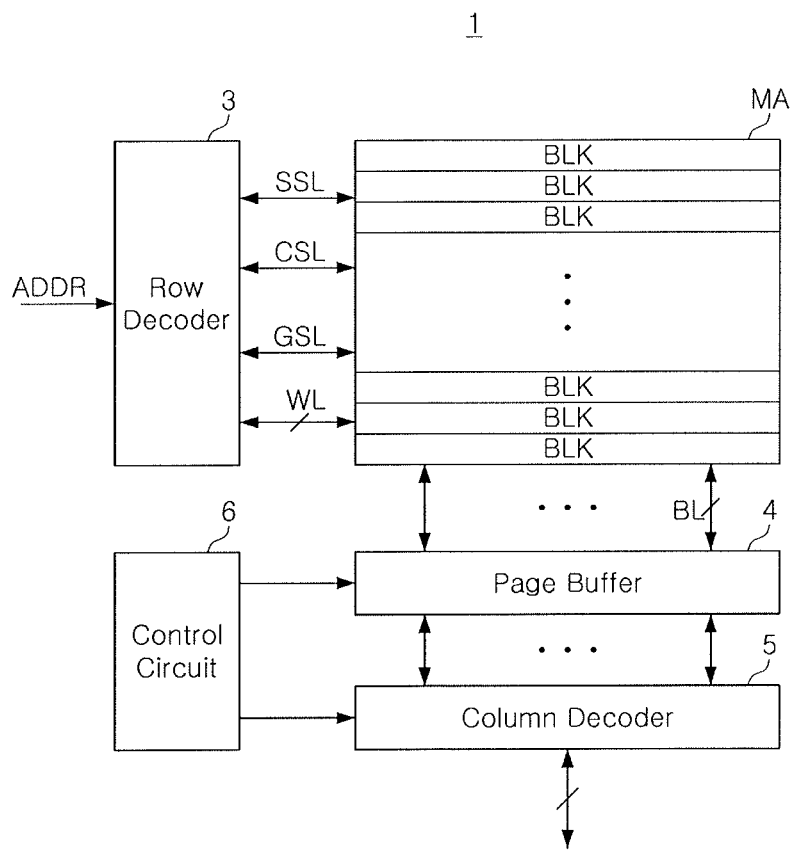
FIG. 1 illustrates a schematic block diagram of an example of a three-dimensional semiconductor device according to an example embodiment.

With reference to FIG. 1, an example of a three-dimensional semiconductor device according to an example embodiment will be described. FIG. 1 is a schematic block diagram of a semiconductor device according to an example embodiment.

With reference to FIG. 1, a three-dimensional semiconductor device 1 may include a memory cell array region MA, a row decoder 3, a page buffer 4, a column decoder 5, and a control circuit 6. The memory cell array region MA may include memory blocks BLK.

The memory cell array region MA may include memory cells arrayed in a plurality of rows and columns. The memory cells included in the memory cell array region MA may be electrically connected to the row decoder 3 by word lines WL, at least one common source line CSL, string select lines SSL, at least one ground select line GSL, or the like. The memory cells may also be electrically connected to the page buffer 4 and the column decoder 5 by bit lines BL.

In an example embodiment, among the memory cells, the memory cells arrayed in the same row may be connected to a common word line WL, while the memory cells arrayed in the same column may be connected to a common bit line BL.

The row decoder 3 may commonly be connected to the memory blocks BLK and may provide a driving signal to the word lines WL of the memory blocks BLK selected according to a block select signal. In detail, the row decoder 3 may receive address information ADDR from an external source and decode the address information ADDR having been received, thereby determining a voltage to be supplied to at least a portion of the word lines WL, the common source line CSL, the string select lines SSL, and the ground select line GSL, electrically connected to the memory blocks BLK.

The page buffer 4 may be electrically connected to the memory cell array region MA by the bit lines BL. The page buffer 4 may be connected to a bit line BL selected according to an address decoded by the column decoder 5. The page buffer 4 may temporarily store data to be stored in memory cells or may detect data stored in the memory cells according to an operating mode. For example, the page buffer 4 may be operated as a writing driver circuit in an operating mode of a program and may be operated as a sense amplifier circuit in a reading mode. The page buffer 4 may receive electrical energy (e.g., a voltage or an electric current) from a control logic to be transmitted to the bit line BL having been selected.

The column decoder 5 may provide a data transmission path between the page buffer 4 and an external device (e.g., a memory controller). The column decoder 5 may decode an address input from an external source to select one of the bit lines BL.

The column decoder 5 may commonly be connected to the memory blocks BLK and may provide data information to the bit lines BL of the memory block BLK selected according to the block select signal.

The control circuit 6 may control overall operations of the three-dimensional semiconductor device 1. The control circuit 6 may receive a control signal and an external voltage and may be operated according to the control signal having been received. The control circuit 6 may include a voltage generator generating voltages required for an internal operation (e.g., a program voltage, a read voltage, an erase voltage, or the like) using the external voltage. The control circuit 6 may control a read operation, a write operation and/or an erase operation in response to control signals.

Figure 2:
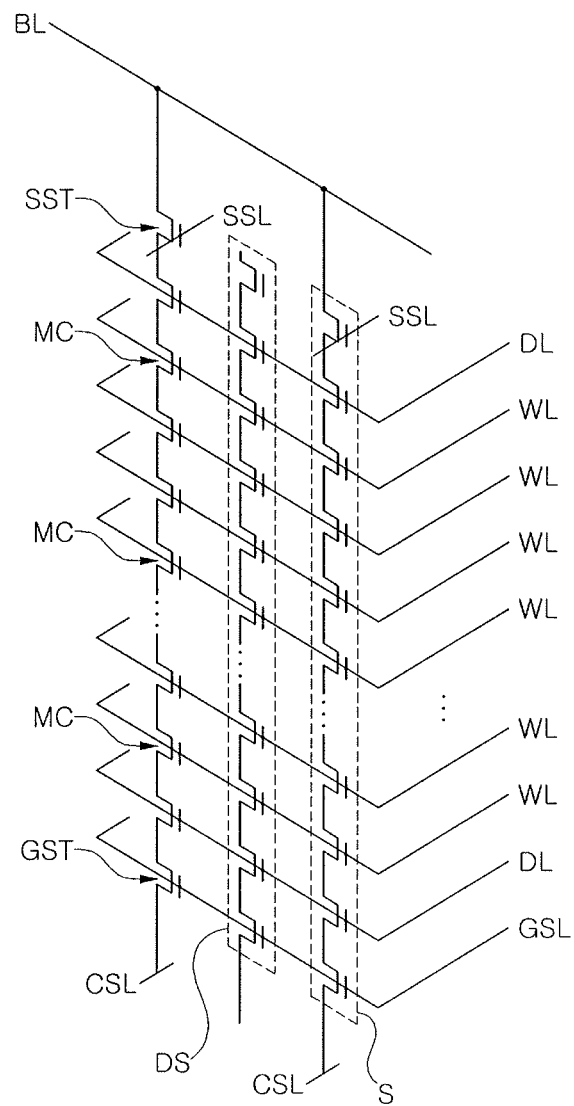
FIG. 2 illustrates a schematic circuit diagram of a memory cell array of a three-dimensional semiconductor device according to an example embodiment.

With reference to FIG. 2, a circuit of the memory cell array region (MA of FIG. 1) of the three-dimensional semiconductor device 1 will be described. FIG. 2 is a circuit diagram schematically illustrating a circuit of the memory cell array region (MA of FIG. 1).

With reference to FIG. 2, the memory cell array region (MA of FIG. 1) may include memory strings S including memory cells MC connected in series, as well as a ground select transistor GST and a string select transistor SST, connected to opposing ends of the memory cells MC in series. The memory cells MC connected in series may be connected to the word lines WL, respectively, for selecting the memory cells MC.

A gate terminal of the ground select transistor GST may be connected to the ground select line GSL, while a source terminal may be connected to the common source line CSL. A gate terminal of the string select transistor SST may be connected to the string select line SSL, while the source terminal may be connected to a drain terminal of the memory cells MC. FIG. 2 illustrates a structure in which a single ground select transistor GST and a single string select transistor SST are connected to the memory cells MC, connected in series. Alternatively, however, a plurality of ground select transistors GST or a plurality of string select transistors SST may also be connected to the memory cells MC.

In an example embodiment, a dummy line DL may be disposed between an uppermost word line WL and the string select line SSL and between a lowermost word line WL and the ground select line GSL among the word lines WL.

A drain terminal of the string select transistor SST may be connected to a plurality of bit lines BL. When a signal is applied to a gate terminal of the string select transistor SST through the string select line SSL, a signal applied through the bit line BL may be transmitted to the memory cells MC connected in series to perform a data reading and writing operation. In addition, an erase voltage having a predetermined level may be applied through a substrate, thereby performing an erase operation erasing data recorded in the memory cells MC.

The three-dimensional semiconductor device according to an example embodiment may include at least one dummy string DS. The dummy string DS may be provided as a string including a dummy channel electrically isolated from the bit line BL.

Subsequently, with reference to FIG. 3, an example of a three-dimensional semiconductor device according to an example embodiment will be described.

Figure 3:
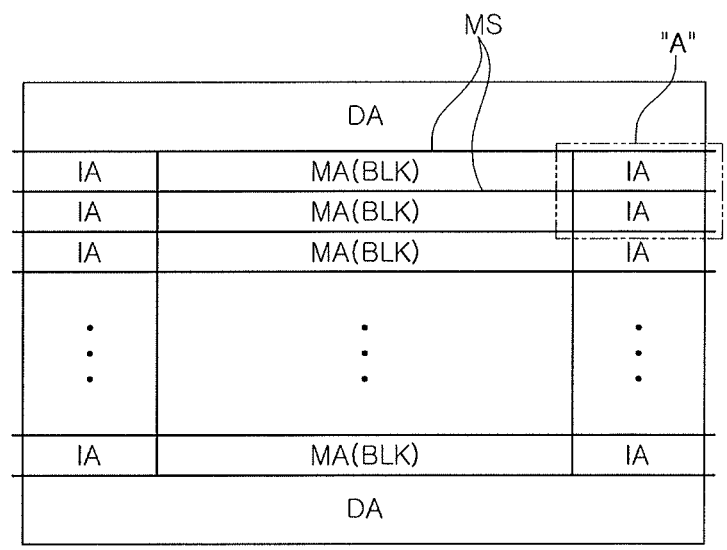
FIG. 3 illustrates a schematic block diagram of an example of a three-dimensional semiconductor device according to an example embodiment.

With reference to FIG. 3, memory blocks BLK may be disposed on a memory cell array region MA. A connection region IA may be disposed on at least one side of the memory cell array region MA. For example, the connection regions IA may be disposed on opposing sides of the memory cell array region MA. The memory cell array region MA and the connection region IA may be disposed between dummy regions DA.

In an example embodiment, the memory cell array region MA may be provided as an area in which memory cells (MC in FIG. 2) are disposed. The connection region IA may be provided as a region in which pad regions of gate electrodes in contact with contact plugs to apply an electrical signal or a voltage to string select lines (SSL of FIG. 2), word lines (WL of FIG. 2), and/or a ground select line (GSL of FIG. 2) are disposed.

The memory blocks BLK may be disposed between main separation structures MS intersecting the memory cell array region MA and the connection region IA.

Figure 4A:
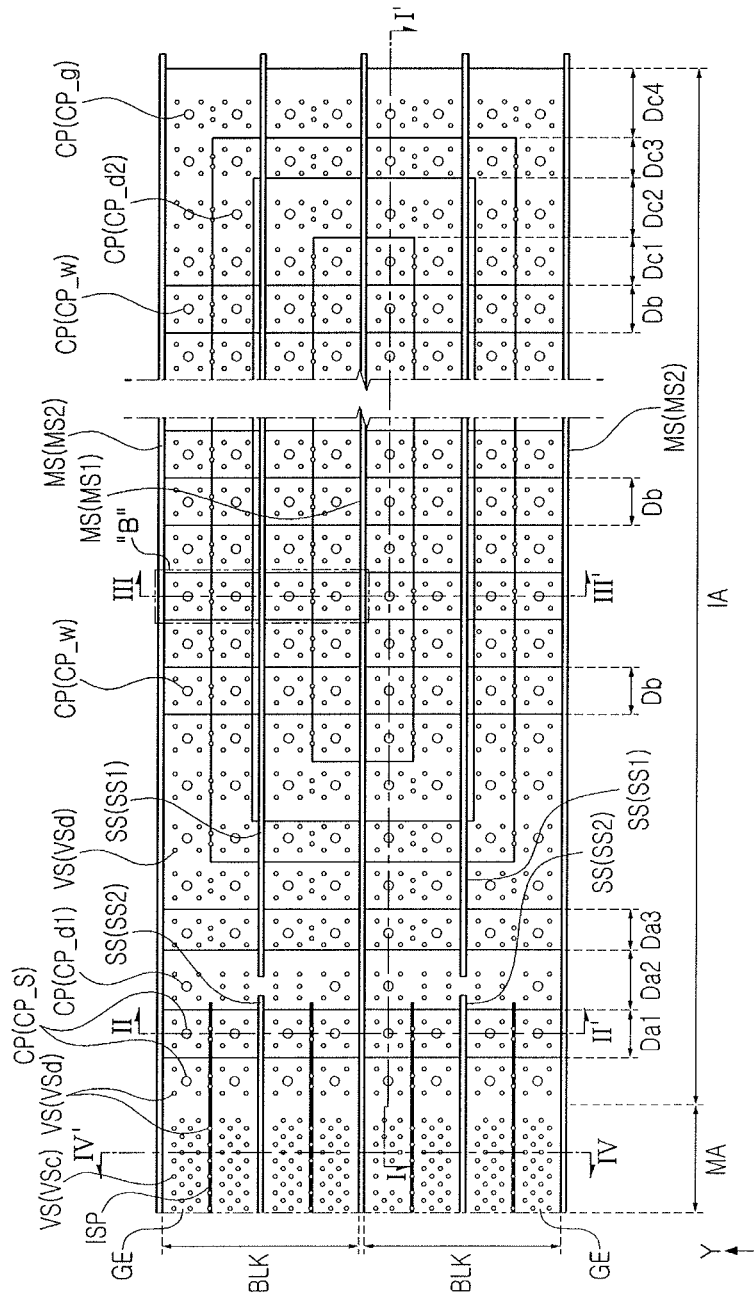
FIG. 4A illustrates a schematic top view of an example of a three-dimensional semiconductor device according to an example embodiment.
Figure 4B:
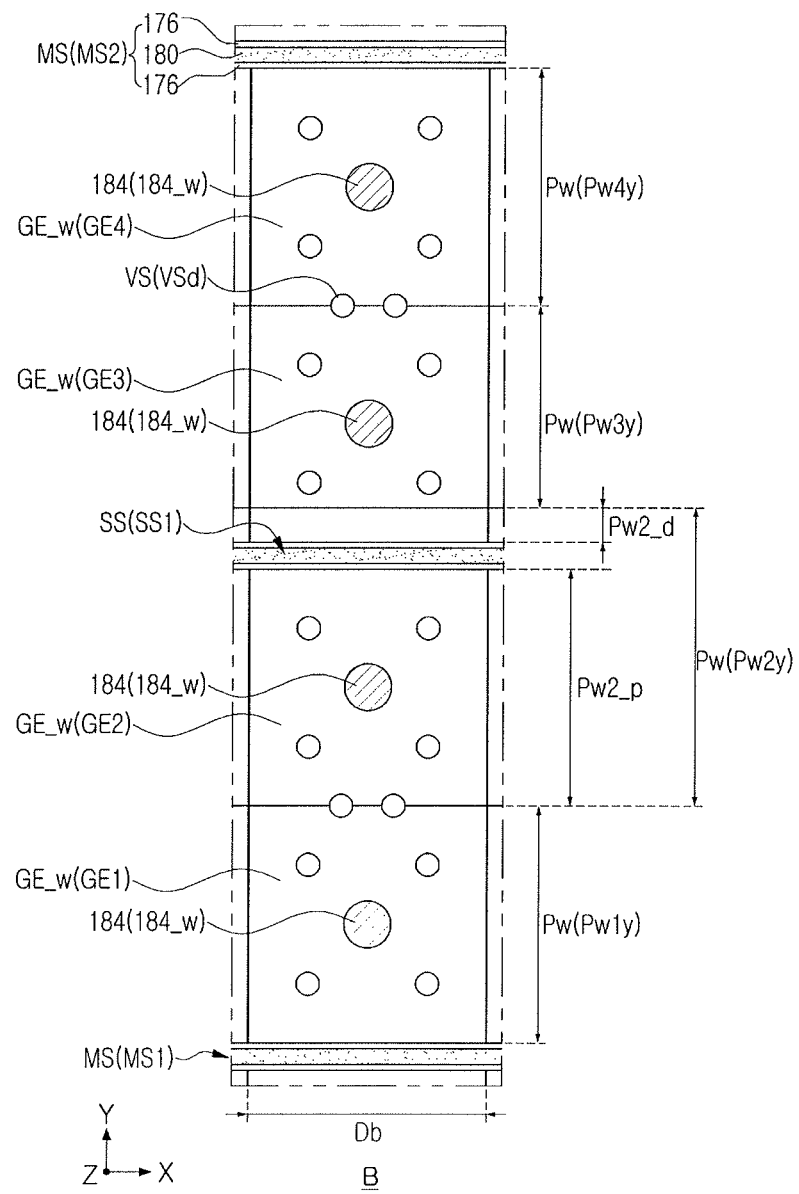
FIG. 4B illustrates a partially enlarged view of a portion of FIG. 4A according to an example embodiment.
Figure 5A:
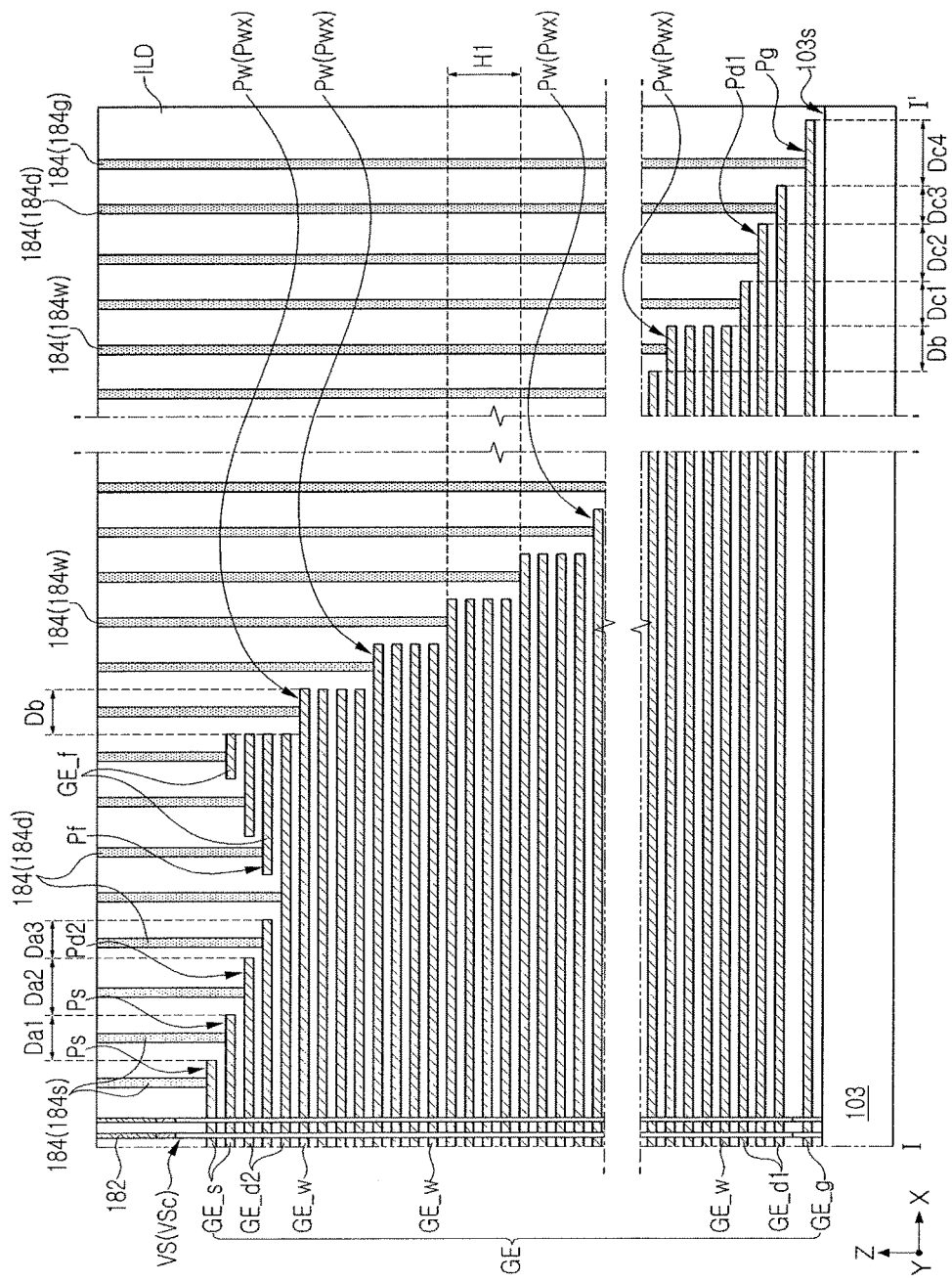
FIGS. 5A to 5C illustrate schematic cross-sectional views of an example of a three-dimensional semiconductor device according to an example embodiment.
Figure 5B:
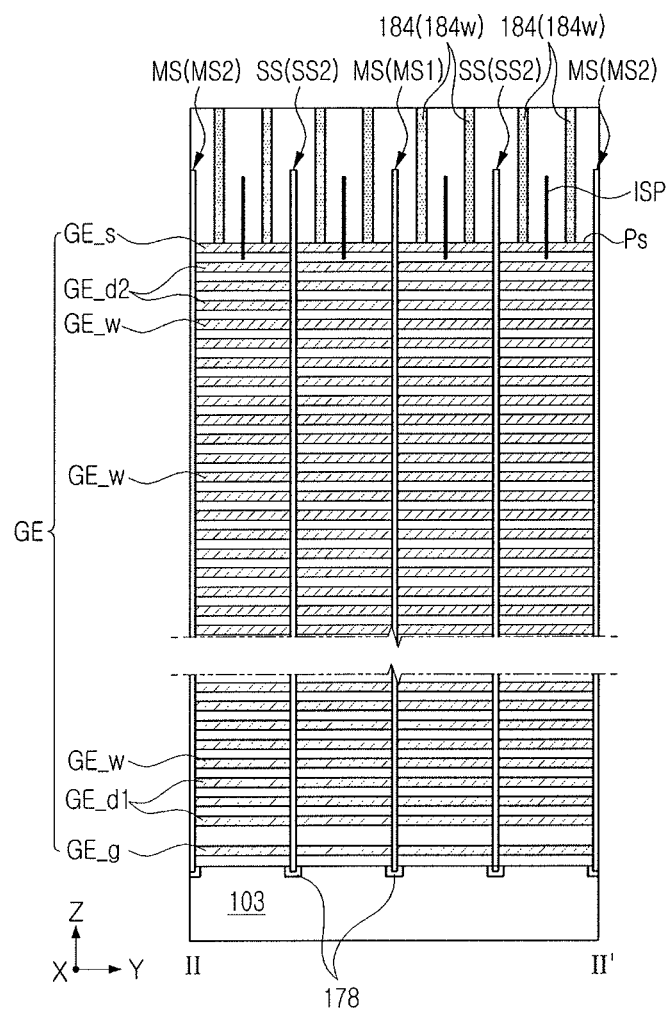
Figure 5C:
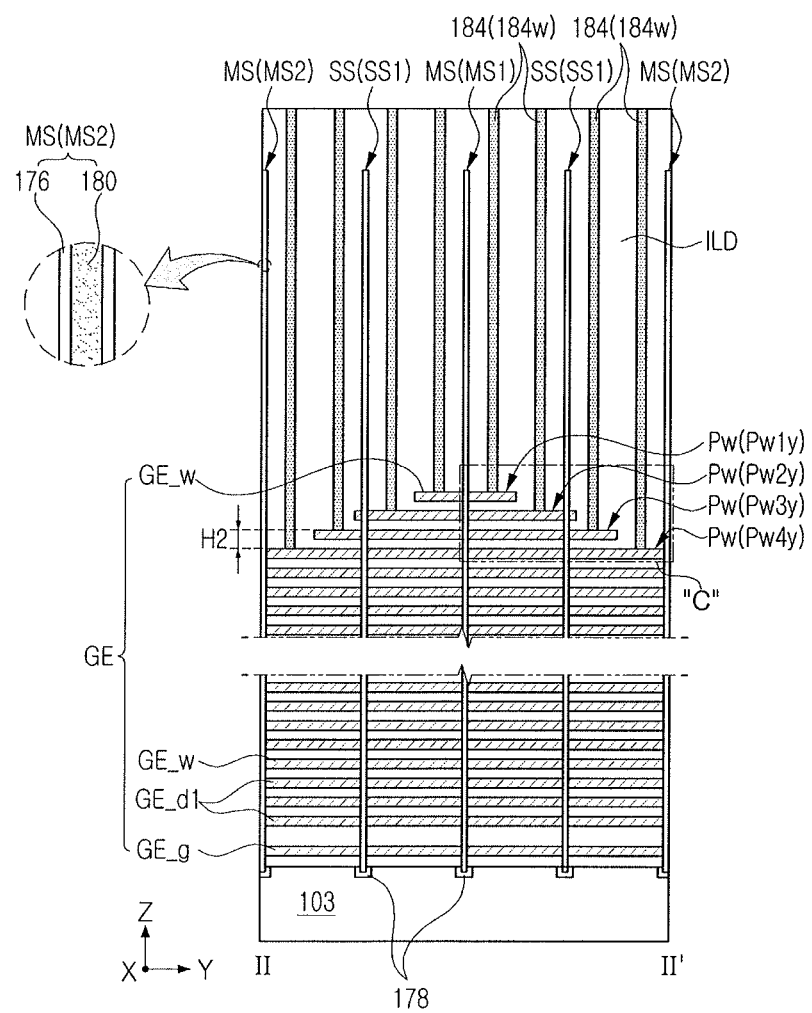

Hereinafter, an example of a three-dimensional semiconductor device according to an example embodiment will be described with reference to FIGS. 3, 4A, 4B, 5A, 5B, and 5C. FIG. 4A is a partially enlarged view of the portion marked "A" of FIG. 3, while FIG. 4B is a partially enlarged view of the portion marked "B" of FIG. 4A. FIG. 5A is a cross-sectional view of a region taken along line I-I' of FIG. 4A, FIG. 5B is a cross-sectional view of a region taken along line II-II' of FIG. 4A, and FIG. 5C is a cross-sectional view of a region taken along line III-III' of FIG. 4A.

With reference to FIGS. 3, 4A, 4B, 5A, 5B, and 5C, gate electrodes GE stacked in a direction Z on top of each other, i.e., along a direction perpendicular to a surface 103s of a substrate 103, may be disposed on the substrate 103. The substrate 103 may be provided as a semiconductor substrate. The gate electrodes GE may be disposed in a memory cell array region MA described in FIG. 3 and may be extended to a connection region IA described in FIG. 3. Each of the gate electrodes GE may be parallel to the surface 103s of the substrate 103.

The gate electrodes GE may be formed using a conductive material including at least one of doped polysilicon, a metallic nitride (e.g., titanium nitride (TiN)), a metallic silicide (e.g., tungsten silicon (WSi), titanium silicon (TiSi), tantalum silicon (TaSi), or the like), or a metal (e.g., tungsten (W)). The doped polysilicon may be provided as polysilicon including an n-type impurity (e.g., phosphorous (P), Arsenic (As), or the like) or a p-type impurity (e.g., boron (B), or the like).

The gate electrodes GE may include one or more lower gate electrodes GE_g and GE_d1, intermediate gate electrodes GE_w on the one or more lower gate electrodes GE_g and GE_d1, described above, and one or more upper gate electrodes GE_s and GE_d2 on the intermediate gate electrodes (GE_w).

In an example embodiment, the one or more lower gate electrodes GE_g and GE_d1 may be provided in plural. A plurality of lower gate electrodes GE_g and GE_d1 may include a lowermost lower gate electrode GE_g and a plurality of lower electrodes GE_d1 disposed on the lowermost lower gate electrode GE_g. The lowermost lower gate electrode GE_g may be provided as a lower select gate electrode GE_g, while the plurality of lower electrodes GE_d1 may be provided as dummy gate electrodes. The lowermost lower gate electrode GE_g, that is, the lower select gate electrode, may be provided as the ground select line (GSL in FIGS. 1 and 2) illustrated in FIGS. 1 and 2.

The intermediate gate electrodes GE_w may be provided as the word lines (WL in FIGS. 1 and 2) illustrated in FIGS. 1 and 2.

In an example embodiment, the one or more upper gate electrodes GE_s and GE_d2 may be provided in plural. An uppermost upper gate electrode and/or a second uppermost upper gate electrode among a plurality of upper gate electrodes GE_s and GE_d2 may be provided as an upper select gate electrode GE_s. Upper gate electrodes disposed between the upper select gate electrode GE_s and the intermediate gate electrodes GE_w may be provided as upper dummy gate electrodes GE_d2. The upper select gate electrode GE_s may be provided as the string select lines (SSL in FIGS. 1 and 2) illustrated in FIGS. 1 and 2.

Floating dummy gate electrodes GE_f disposed on the intermediate gate electrodes GE_w on the connection region IA and opposing a portion of upper gate electrodes GE_s and GE_d2 may be disposed. The floating dummy gate electrodes GE_f may be formed using the same material as the gate electrodes GE. The floating dummy gate electrodes GE_f may include floating pad regions Pf arrayed to have a stepped shape sequentially lowered in a direction of the upper gate electrodes GE_s and GE_d2.

Main separation structures MS extended in a first direction X and parallel to each other may be disposed on the substrate 103, e.g., each of the main separation structures MS may extend in the first direction X (FIG. 4A) and to a predetermined depth through the gate electrodes GE along a third direction X (FIG. 5B). The main separation structures MS may be disposed on the memory cell array region MA and the connection region IA. The main separation structures MS may intersect the memory cell array region MA and the connection region IA. The main separation structures MS may include a first main separation structure MS1 and second main separation structures MS2 disposed on opposing sides of the first main separation structure MS1, e.g., the first main separation structure MS1 may be between two second main separation structures MS2 along a second direction Y and spaced apart from each of the second main separation structures MS2 along the second direction Y (FIG. 4A).

Secondary separation structures SS may be disposed between the first main separation structure MS1 and, e.g., each of, the second main separation structures MS2 along the second direction Y. The secondary separation structures SS may include a first secondary separation structure SS1 and a second secondary separation structure SS2, disposed to be spaced apart from each other along the first direction X (FIG. 4A).

The first secondary separation structure SS1 may be disposed, e.g., only, in the connection region IA. The second secondary separation structure SS2 may have an end portion intersecting the memory cell array region MA and extended to a portion of the connection region IA to oppose an end portion of the first secondary separation structure SS1, e.g., the second secondary separation structure SS2 may extend from the memory cell array region MA into the connection region IA along the first direction X to be collinear with while spaced apart from the first secondary separation structure SS1.

Referring to FIGS. 4B and 5C, each of the main separation structures MS and the secondary separation structures SS may include a conductive pattern 180 and a spacer 176 covering a side surface of the conductive pattern 180. The spacer 176 may be formed using an insulating material, e.g., a silicon oxide or a silicon nitride. The conductive pattern 180 may be formed using a conductive material including at least one among a metallic nitride, e.g., doped polysilicon and a titanium nitride, or a metal, e.g., W.

Referring to FIGS. 5B and 5C, impurity regions 178 may be disposed in the substrate 103 below the main separation structures MS and the secondary separation structures SS. The impurity regions 178 may form the common source line (CSL in FIGS. 1 and 2) illustrated in FIGS. 1 and 2. The impurity regions 178 may have n-type conductivity, while a portion of the substrate 103 disposed adjacent to the impurity regions 178 may have p-type conductivity.

Referring to FIGS. 4A and 5B, an insulating pattern (ISP) intersecting the upper select gate electrode GE_s and separating the upper select gate electrode GE_s in a width direction Y of the main separation structure MS and the secondary separation structures SS may be disposed. The insulating pattern ISP may be formed using, e.g., a silicon oxide.

According to example embodiments, the gate electrodes GE may have pad regions arrayed in the connection region IA in three dimensions. As such, the pad regions arrayed in three dimensions may allow the semiconductor device to be highly integrated.

In detail, as illustrated in FIG. 5A, the upper select gate electrode GE_s may include upper select pad regions Ps, while the upper dummy gate electrodes GE_d2 may include upper dummy pad regions Pd2. The upper select pad regions Ps and the upper dummy pad regions Pd2 may form upper pad regions Ps and Pd2 of the upper gate electrodes GE_s and GE_d2. Among the upper select pad regions Ps, a length Da1 of a second uppermost upper select pad region in the first direction X may be less than a length Da2 of the uppermost upper dummy pad region Pd2 in the first direction X disposed below the second uppermost upper select pad region. Among the upper dummy pad regions Pd2, the length Da2 of the uppermost upper dummy pad region Pd2 in the first direction X may be greater than a length Da3 of the second uppermost upper dummy pad region in the first direction X. For example, referring to FIG. 5A, each of the lengths Da1, Da2, and Da3 refers to a length of a gate electrode GE extending beyond a gate electrode GE thereabove along the first direction X, e.g., where an upper surface of a gate electrode GE is exposed for a pad region.

Upper pad regions Ps and Pd2 may be lowered by a first step portion in the first direction X away from the memory cell array region MA, and may be arrayed to be disposed on the same level in a second direction Y perpendicular to the first direction X. For example, as illustrated in FIG. 5A, each of the upper pad regions Ps and Pd2 may extend farther along the first direction X than a pad region immediately thereabove when oriented from the memory cell array region MA toward the connection region IA, e.g., with a similar configuration in the second direction Y. The first direction X and the second direction Y may be parallel to the surface 103s of the substrate 103.

As further illustrated in FIG. 5A, among the lower gate electrodes GE_g and GE_d1, the lower select gate electrode GE_g may include a lower select pad region Pg, while the lower dummy gate electrodes GE_d1 may include lower dummy pad regions Pd1. The floating dummy gate electrodes GE_f may include floating dummy pad regions Pf. The floating dummy pad regions Pf may include a stepped shape lowered in a direction of the memory cell array region MA, e.g., each of the floating dummy pad regions Pf may extend farther along the first direction X than a pad region immediately thereabove when oriented from the connection region IA toward the memory cell array region MA. Among the lower dummy pad regions Pd1, a length Dc3 of a lowermost lower dummy pad region in the first direction X may be less than each of a length Dc1 of the uppermost lower dummy pad region in the first direction X and a length Dc2 of an intermediate lower dummy pad region in the first direction X. The length Dc2 of the intermediate lower dummy pad region in the first direction X may be greater than the length Dc1 of the uppermost lower dummy pad region in the first direction X.

As further illustrated in FIGS. 5A and 5C, the intermediate gate electrodes GE_w may include intermediate pad regions Pw. The intermediate pad regions Pw may include pad regions Pwx extending in the first direction X (FIG. 5A) and pad regions Pw1y, Pw2y, Pw3y, and Pw4y extending in the second direction Y (FIG. 5C). The pad regions Pwx may be sequentially lowered by a first step portion H1 in the first direction X in a direction oriented from the memory cell array region MA toward the connection region IA. The pad regions Pw1y, Pw2y, Pw3y, and Pw4y may be lowered by a second step portion H2 lower than the first step portion H1 in the second direction Y oriented in a direction from the first main separation structure MS1 toward the second main separation structure MS2 e.g., each of the pad regions Pw1y, Pw2y, Pw3y, and Pw4y may extend farther along the second direction Y than a pad region immediately thereabove when oriented from the first main separation structure MS1 toward each of the second main separation structures MS2 (FIG. 5C). For example, as illustrated in FIG. 5C, the second step portion H2 may refer to a vertical distance along the third direction Z between two upper surfaces of immediately adjacent pad regions Pw (i.e., pad regions Pw of two gate electrodes GE immediately adjacent to each other along the third direction Z). For example, as illustrated in FIG. 5A, the first step portion H1 may refer to a vertical distance along the third direction Z between two upper surfaces of pad regions Pw having multiple gate electrodes GE therebetween, e.g., four gate electrodes GE adjacent to each other may be aligned to have a same length along the first direction X with a single pad region Pw on top of an uppermost gate electrode of the four gate electrodes GE.

In an example embodiment, a length Dc4 of the lower select pad region Pg in the first direction X may be greater than a length Db of the intermediate pad regions Pw in the first direction X. The length Dc1 of the uppermost lower dummy pad region in the first direction X and the length Dc2 of the intermediate lower dummy pad region in the first direction X may be greater than the length Db of the intermediate pad regions Pw in the first direction X. In an example embodiment, the length Da2 of either of the upper pad regions Ps and Pd2 in the first direction X may be greater than the length Db of the intermediate pad regions Pw in the first direction X.

Referring to FIGS. 4B and 5A, contact plugs 184 may be disposed on the pad regions of the gate electrodes GE. The contact plugs 184 may include a lower contact plug 184g electrically connected to the lower select pad region Pg of the lower select gate electrode GE_g, intermediate contact plugs 184w electrically connected to the intermediate pad regions Pw of the intermediate gate electrodes GE_w, a string select contact plug 184s electrically connected to the upper select pad region Ps of the upper select gate electrode GE_s, dummy contact plugs 184d on the lower dummy pad regions Pd1 and the upper dummy pad regions Pd2, and dummy contact plugs 184d on the floating pad regions Pf.

Figure 6:
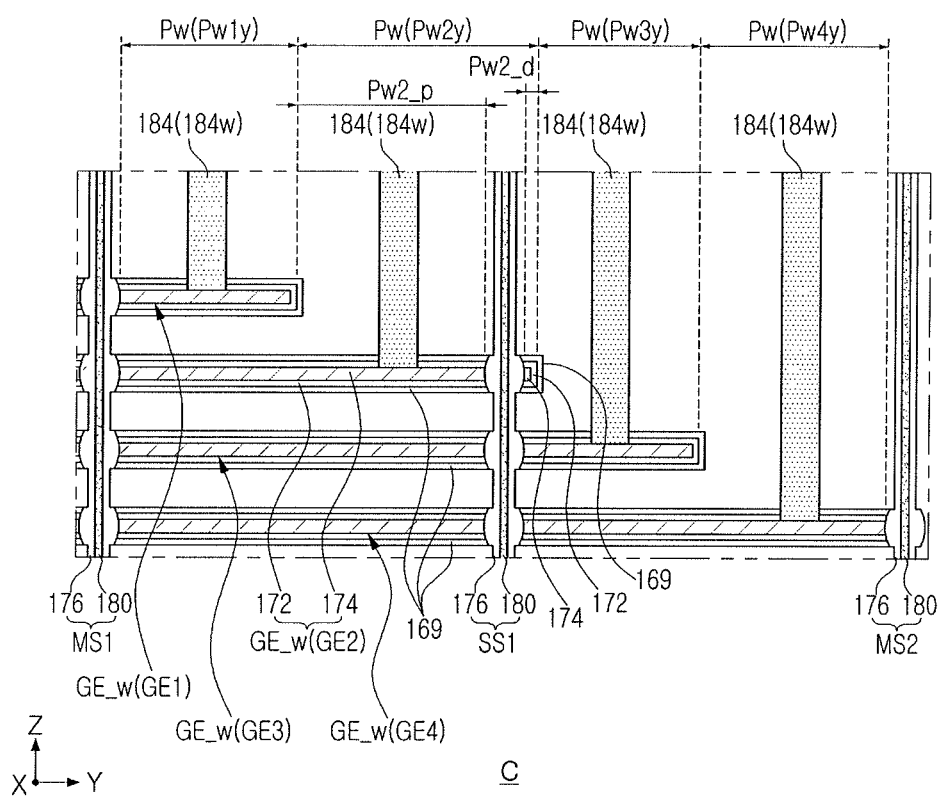
FIG. 6 illustrates a partially enlarged view of a portion of FIG. 5C according to an example embodiment.

Pad regions Pw1y, Pw2y, Pw3y, and Pw4y arrayed in the second direction Y among the intermediate pad regions Pw, and gate electrodes GE1, GE2, GE3, and GE4 including the pad regions Pw1y, Pw2y, Pw3y, and Pw4y will be described with reference to FIGS. 6 and 7 in more detail. FIG. 6 is a partially enlarged view of the portion marked "C" of FIG. 5C, while FIG. 7 is an exploded perspective view of gate electrodes GE1, GE2, GE3, and GE4 including the pad regions Pw1y, Pw2y, Pw3y, and Pw4y.

Figure 7:
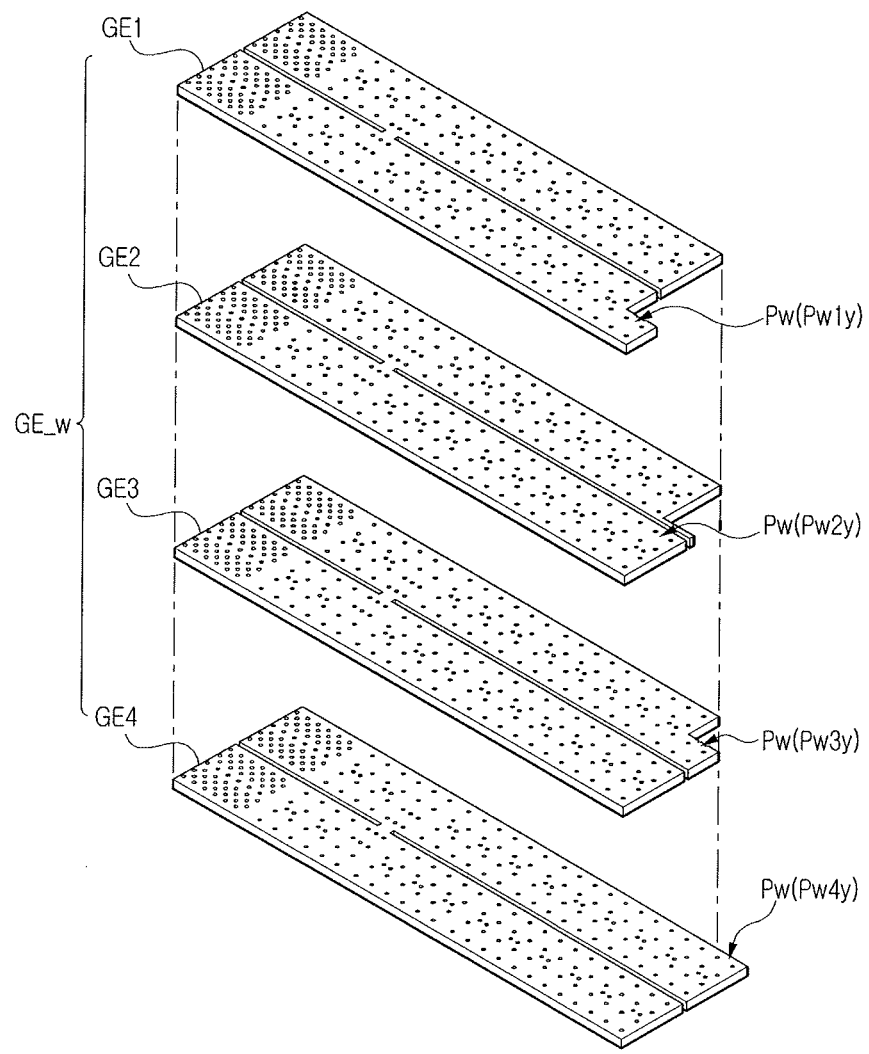
FIG. 7 illustrates an exploded perspective view of a component of a three-dimensional semiconductor device according to an example embodiment.

With reference to FIGS. 6 and 7, the pad regions Pw1y, Pw2y, Pw3y, and Pw4y arrayed in the second direction Y may include a first pad region Pw1y, a second pad region Pw2y, a third pad region Pw3y, and a fourth pad region Pw4y arrayed to have a stepped shape sequentially lowered by the second step portion H2 in the second direction Y oriented from the first main separation structure MS1 to the second main source structure MS2. Intermediate gate electrodes GE_w may include a first gate electrode GE1 including the first pad region Pw1y, a second gate electrode GE2 including the second pad region Pw2y, a third gate electrode GE3 including the third pad region Pw3y, and a fourth gate electrode GE4 including the fourth pad region Pw4y.

In an example embodiment, a length of the third pad region Pw3y may be less than that of one of the first pad region Pw1y, the second pad region Pw2y, and the fourth pad region Pw4y in the second direction Y. In an example embodiment, the length of the third pad region Pw3y may be less than that of each of the first pad region Pw1y, the second pad region Pw2y, and the fourth pad region Pw4y in the second direction Y.

A first secondary separation structure SS1 may intersect the second pad region Pw2y and may divide the second pad region Pw2y into a pad portion Pw2_p and a dummy portion Pw2_d. In the second pad region Pw2y, the pad portion Pw2_p may be larger than the dummy portion Pw2_d. A length of the pad portion Pw2_p of the second pad region Pw2y in the second direction Y may be greater than a length of the third pad region Pw3y in the second direction Y.

In an example embodiment, gate electrodes GE including the intermediate gate electrodes GE_w may include a first conductive material 172 and a second conductive material 174. Thus, the pad regions Pw1y, Pw2y, Pw3y, and Pw4y of the intermediate gate electrodes GE_w may include the first conductive material 172 and the second conductive material 174. In the second pad region Pw2y, the pad portion Pw2_p and the dummy portion Pw2_d may include the first conductive material 172 and the second conductive material 174.

The third gate electrode GE3 may expose the fourth pad region Pw4y, the second gate electrode GE2 may expose the third pad region Pw3y and the fourth pad region Pw4y, and the first gate electrode GE1 may expose the second pad region Pw2y, the third pad region Pw3y, and the fourth pad region Pw4y. Thus, the first gate electrode GE1, the second gate electrode GE2, the third gate electrode GE3, and the fourth gate electrode GE4 may include pad regions Pw1y, Pw2y, Pw3y, and Pw4y arrayed in the second direction Y.

The first gate electrode GE1, the second gate electrode GE2, the third gate electrode GE3, and the fourth gate electrode GE4 may be disposed between the first main separation structure MS1 and the second main source structure MS2. Each of the first gate electrode GE1, the second gate electrode GE2, the third gate electrode GE3, and the fourth gate electrode GE4 may be connected to each other on the same plane to be integrally formed through a portion in which the first secondary separation structure SS1 opposes the second secondary separation structure SS2.

Figure 8:
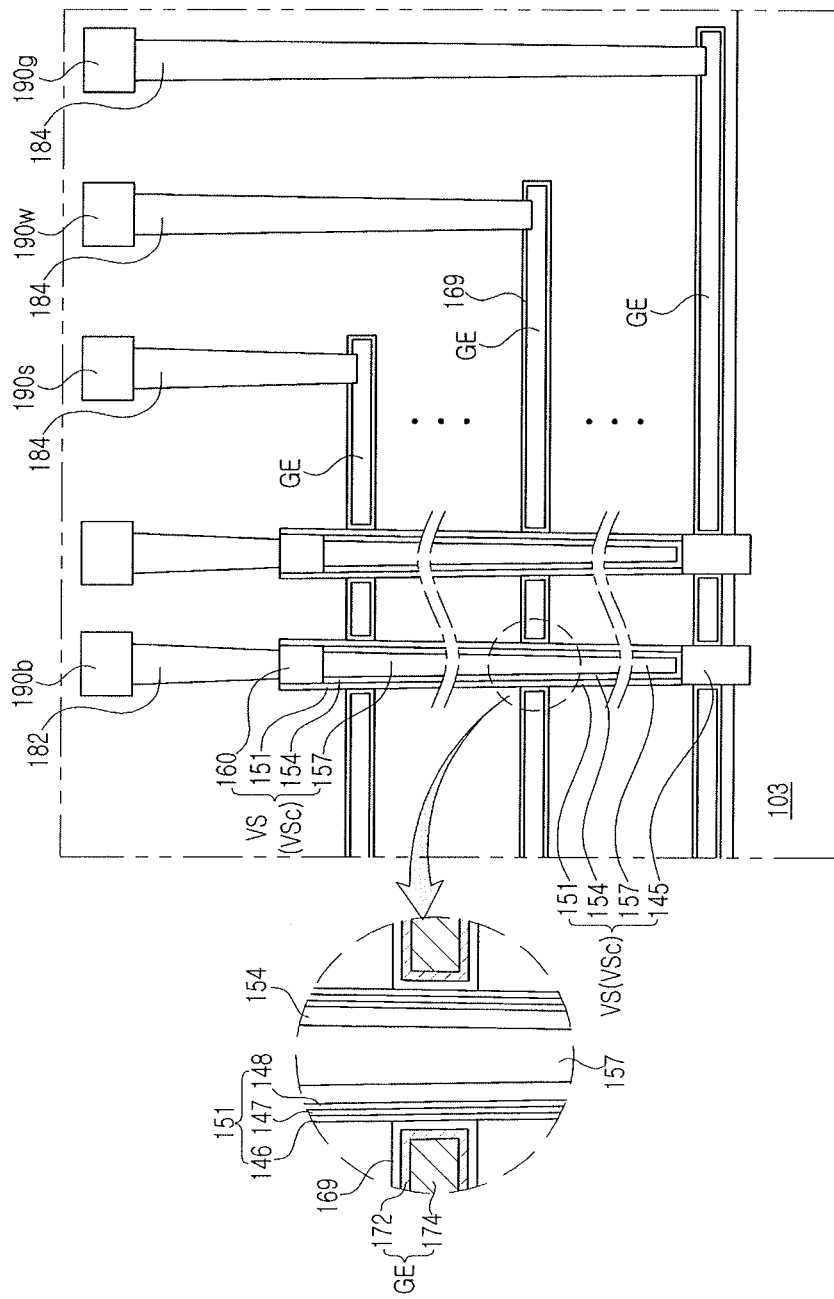
FIG. 8 illustrates a schematic longitudinal cross-sectional view of components in a three-dimensional semiconductor device according to an example embodiment.

Subsequently, an example of the gate electrodes GE including the intermediate gate electrodes GE_w, an example of vertical cell structures VSc, and a wiring connection relation of the vertical cell structures VSc and the gate electrodes GE will be described with reference to FIG. 8. FIG. 8 is a cross-sectional view schematically illustrating an example of a three-dimensional semiconductor device according to an example embodiment.

With reference to FIG. 8, each of vertical cell structures VSc may include a semiconductor pattern 145, a core pattern 157, a pad pattern 160, a channel semiconductor layer 154, and a first gate dielectric 151. A second gate dielectric 169 disposed on an upper surface/lower surface of the gate electrodes GE and extended between the vertical cell structures VSc and the gate electrodes GE may be disposed.

The semiconductor pattern 145 may be in contact with a substrate 103. In an example embodiment, the semiconductor pattern 145 may be provided as an epitaxial material layer formed using a selective epitaxial growth (SEG) process. For example, the semiconductor pattern 145 may be formed using monocrystalline silicon.

The core pattern 157 may be disposed on the semiconductor pattern 145 and may be formed using an insulating material (e.g., a silicon oxide, or the like). The pad pattern 160 may be disposed on the core pattern 157. The pad pattern 160 may be formed using, e.g., polysilicon having n-type conductivity, and may be provided as a drain region. The pad pattern 160 may be disposed on a level higher than the gate electrodes GE.

The channel semiconductor layer 154 may be in contact with the semiconductor pattern 145 and may be extended in a direction perpendicular to a surface of the substrate 103. The channel semiconductor layer 154 may cover a side surface of the core pattern 157 and may be in contact with the pad pattern 160. The channel semiconductor layer 154 may penetrate through word lines WL and string select lines SSL of the gate electrodes GE. The channel semiconductor layer 154 may be formed using a polysilicon layer.

The first gate dielectric 151 may cover an external side of the channel semiconductor layer 154 and may be disposed between the channel semiconductor layer 154 and the gate electrodes GE. Any one of the first gate dielectric 151 and the second gate dielectric 169 may include a layer storing information. For example, the first gate dielectric 151 may include a layer storing information. However, an example embodiment is not limited thereto. In detail, the second gate dielectric 169 may include a layer storing information. Hereinafter, an example in which the first gate dielectric 151 includes a layer storing information will be described.

The first gate dielectric 151 may include a tunnel dielectric layer 148, an information storage layer 147, and a blocking dielectric layer 146. The information storage layer 147 may be disposed between the tunnel dielectric layer 148 and the blocking dielectric layer 146. The tunnel dielectric layer 148 may be disposed adjacent to the channel semiconductor layer 154, while the blocking dielectric layer 146 may be disposed adjacent to the gate electrodes GE.

The tunnel dielectric layer 148 may include, e.g., a silicon oxide and/or an impurity-doped silicon oxide. The blocking dielectric layer 146 may include, e.g., a silicon oxide and/or a high-k dielectric.

The information storage layer 147 may be provided as a layer for storing information in a non-volatile memory device, e.g., a vertical NAND flash memory device, or the like. In detail, the information storage layer 147 may be formed using a material, such as a silicon nitride, trapping and retaining an electron injected from the channel semiconductor layer 154 through the tunnel dielectric layer 148, according to operating conditions of the non-volatile memory device, such as a flash memory device, or erasing an electron trapped in the information storage layer 147. The second gate dielectric 169 may include a high-k dielectric (e.g., an aluminum oxide (AlO), or the like).

The information storage layer 147 may store information in regions in which the information storage layer 147 opposes the gate electrodes corresponding to the word lines (WL of FIG. 2) among the gate electrodes GE. Regions storing information in the information storage layer 147 in any one of the vertical cell structures VSc may be arrayed in a direction perpendicular to a surface of the substrate 103 and may be defined as the memory cells (MC in FIG. 2). First conductive lines 190*b* may be provided as bit lines (BL of FIG. 2) illustrated in FIGS. 1 and 2. Bit line contact structures 182 may be disposed between the first conductive lines 190*b* and the vertical cell structures VSc. The bit line contact structures 182 may electrically connect the first conductive lines 190*b* to the vertical cell structures VSc.

The contact plugs 184 may be disposed on pad regions of the gate electrodes GE. Gate wirings 190*s*, 190*w*, and 190*g* may be disposed on the contact plugs 184. The gate wirings 190*s*, 190*w*, and 190*g* may be provided as wirings applying an electrical signal or a voltage to string select lines (SSL of FIG. 2), the word lines (WL of FIG. 2), and the ground select line (GSL of FIG. 2) among the gate electrodes GE.

In an example embodiment, the vertical cell structures VSc may be disposed to be spaced apart from each other. However, an example embodiment is not limited thereto. For example, vertical cell structures having lower portions connected to each other by a connection portion may be provided. As such, an example of vertical cell structures having the lower portions connected to each other will be described with reference to FIG. 9.

Figure 9:
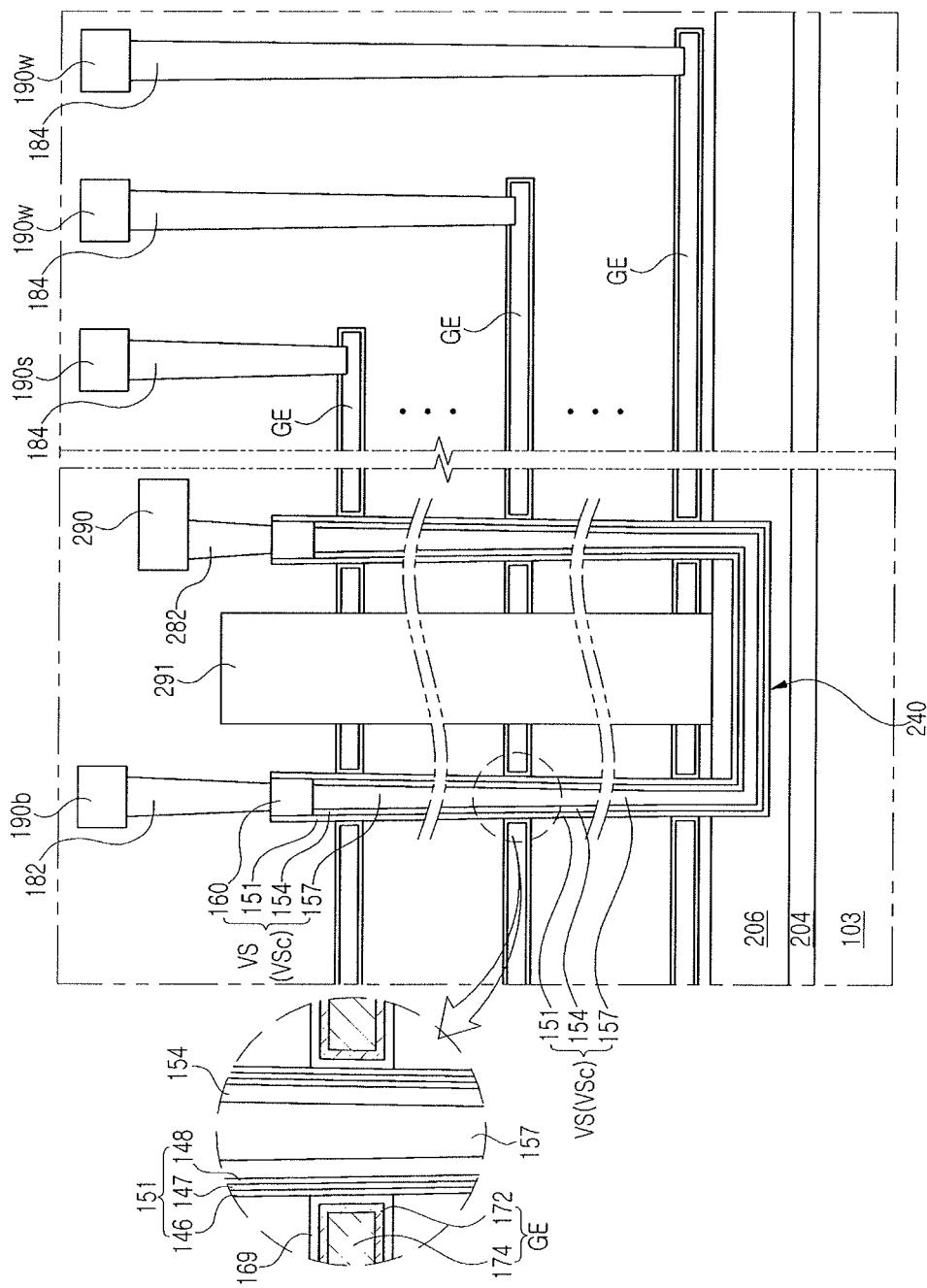
FIG. 9 illustrates a schematic longitudinal cross-sectional view of components in a modified example of a three-dimensional semiconductor device according to an example embodiment.

With reference to FIG. 9, the vertical cell structures VSc connected to each other by a connection portion 240 may be disposed. The vertical cell structures VSc may penetrate through the gate electrodes GE, while the connection portion 240 may allow lower portions of the vertical cell structures VSc to be connected.

Each of the vertical cell structures VSc may include the channel semiconductor layer 154 penetrating through the gate electrodes GE, the core pattern 157, a side surface of which is surrounded by the channel semiconductor layer 154, the pad pattern 160 on the channel semiconductor layer 154, and the first gate dielectric 151 surrounding an edge of the channel semiconductor layer 154 and interposed between the channel semiconductor layer 154 and the gate electrodes GE. The connection portion 240 may be formed in such a manner that the channel semiconductor layer 154, the core pattern 157, and the first gate dielectric 151 in the vertical cell structures VSc are sequentially extended.

The connection portion 240 may be disposed in a lower gate 206 disposed between the substrate 103 and the gate electrodes GE. A base insulating layer 204 may be disposed between the lower gate 206 and the substrate 103. Any one of the vertical cell structures VSc connected to each other by the connection portion 240 may be electrically connected to a source line 290 by a source contact plug 282. The remainder thereof may be electrically connected to the first conductive line 190*b* playing a role as a bit line by the bit line contact structures 182. A separation structure 291 having insulating properties and penetrating through the gate electrodes GE may be disposed on the connection portion 240.

In an example embodiment, as discussed previously with reference to FIG. 6, the first secondary separation structure SS1 may intersect the second pad region Pw2*y* and may divide the second pad region Pw2*y* into the pad portion Pw2_*p* and the dummy portion Pw2_*d*. A component material and a structure of the dummy portion Pw2_*d* may be variously changed depending on a size of the dummy portion Pw2_*d* in the second direction Y. A modified example of the dummy portion Pw2_*d* described above will be described with reference to FIG. 10.

Figure 10:
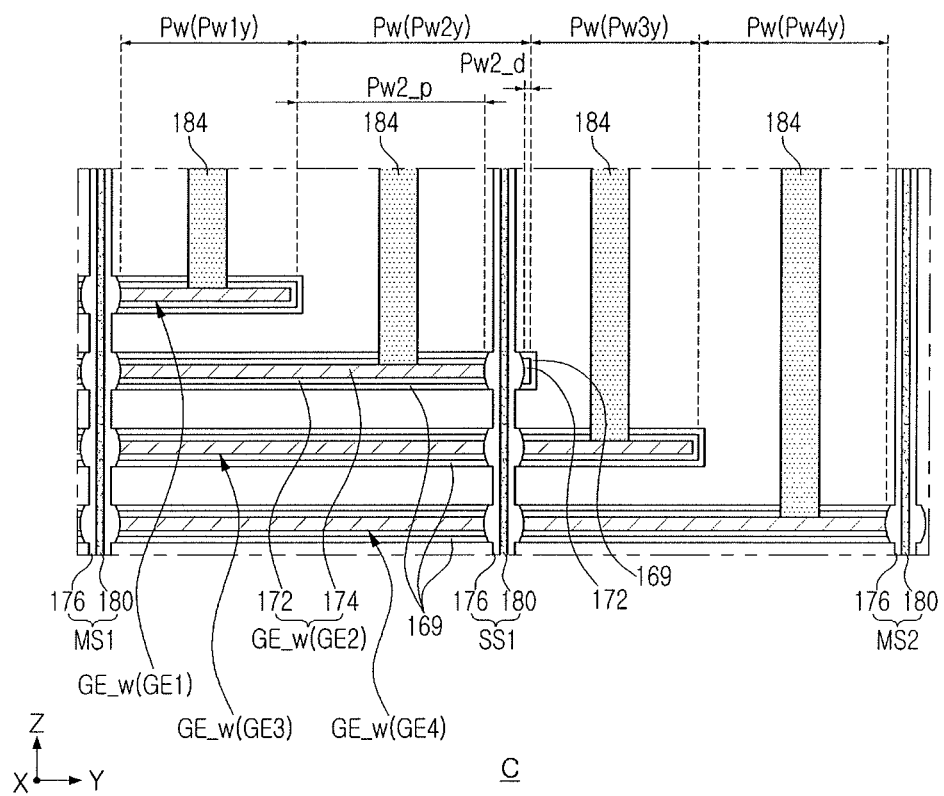
FIG. 10 illustrates a cross-sectional view of a modified example of a three-dimensional semiconductor device according to an example embodiment.

With reference to FIG. 10, the first secondary separation structure SS1 may intersect the second pad region Pw2*y* and may divide the second pad region Pw2*y* into a pad portion Pw2_*p* and a dummy portion Pw2_*d*. The pad portion Pw2_*p* may be formed using the first conductive material 172 and the second conductive material 174, while the dummy portion Pw2_*d* may be formed using the first conductive material 172. Thus, the pad portion Pw2_*p* may include a larger amount of the second conductive material 174 than the dummy portion Pw2_*d*.

Figure 11:
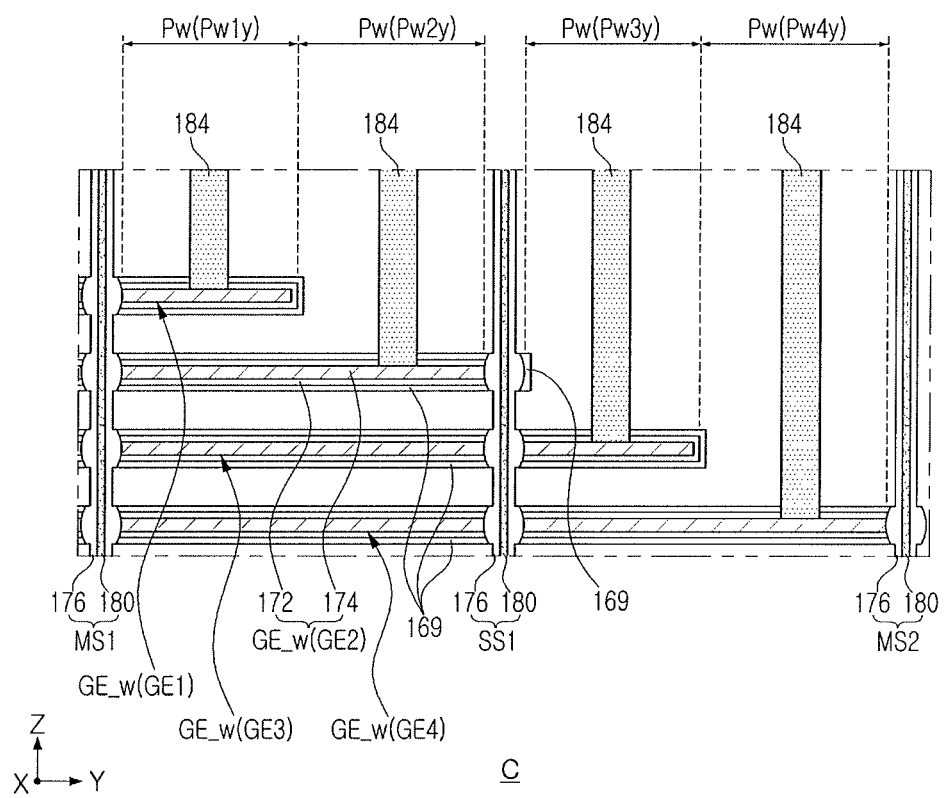
FIG. 11 illustrates a cross-sectional view of another modified example of a three-dimensional semiconductor device according to an example embodiment.

In a modified example, referring to FIG. 11, the second pad region Pw2*y* may not be divided by the first secondary separation structure SS1. That is, the second gate dielectric 169 surrounding the second pad region Pw2*y* may be divided.

Figure 12:
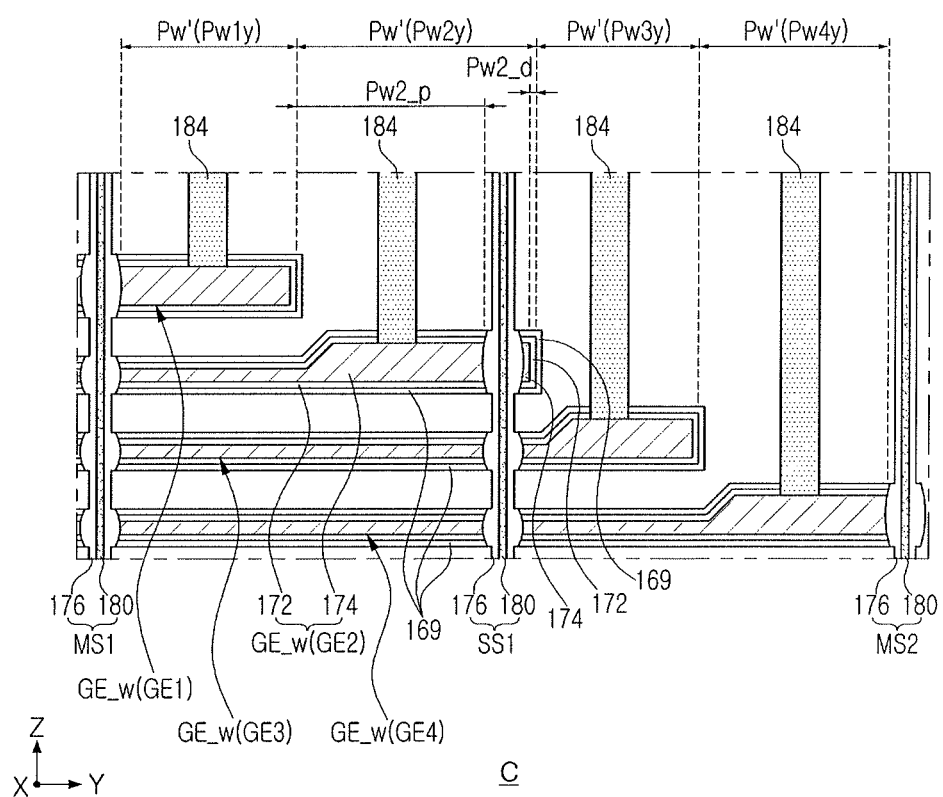
FIG. 12 illustrates a cross-sectional view of a further modified example of a three-dimensional semiconductor device according to an example embodiment.
Figure 13:
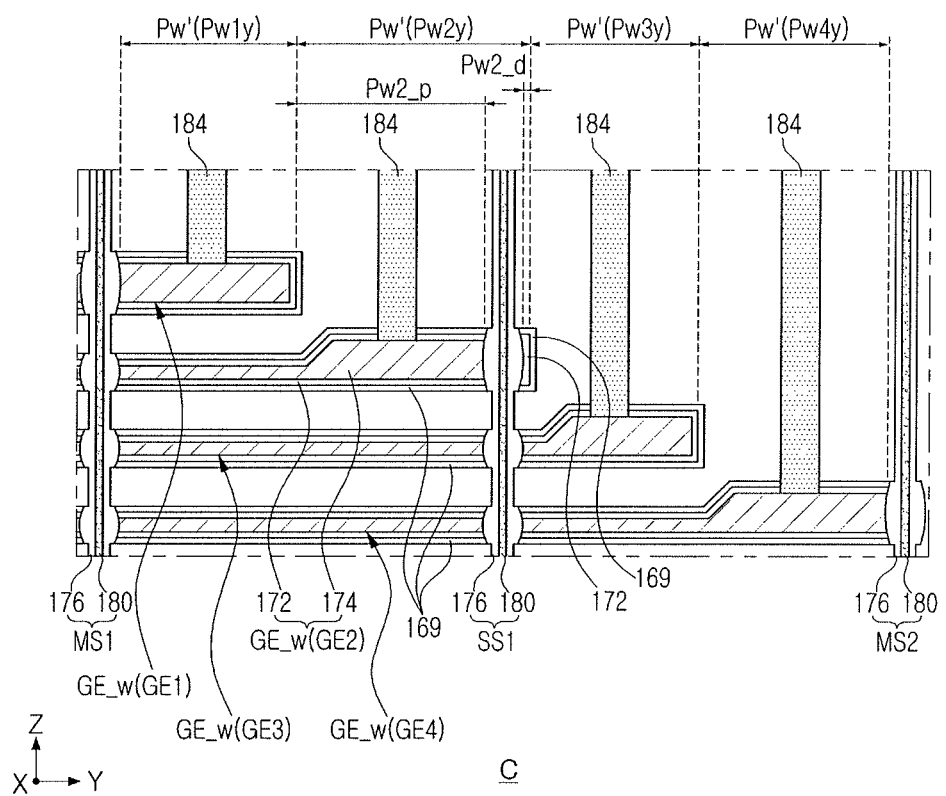
FIG. 13 illustrates a cross-sectional view of a further modified example of a three-dimensional semiconductor device according to an example embodiment.
Figure 14:
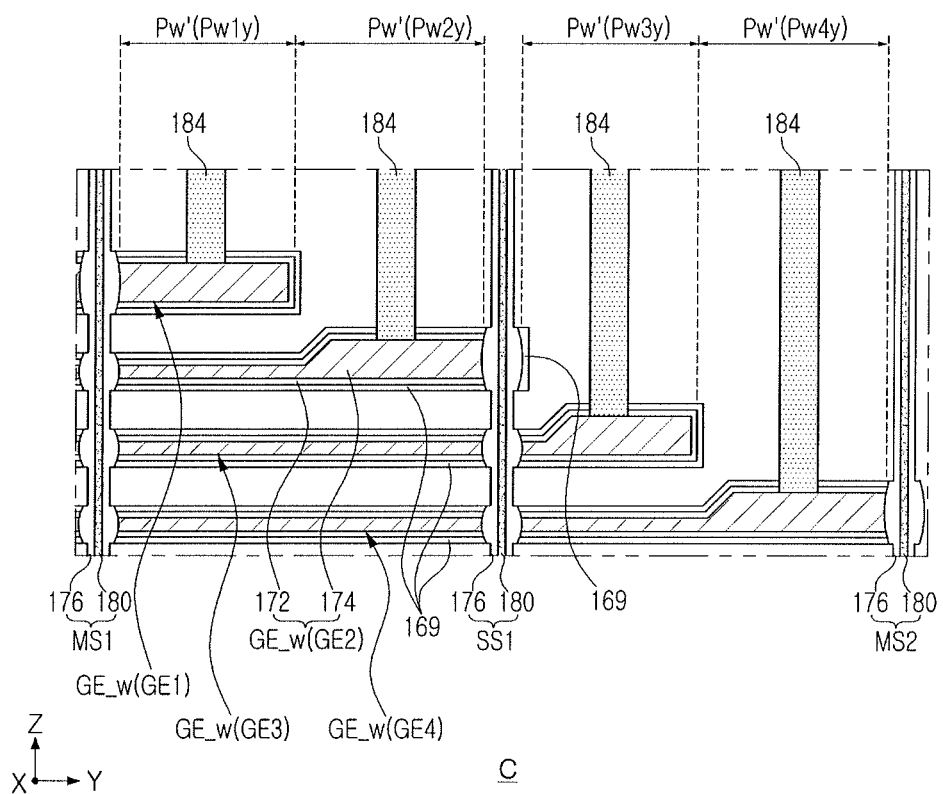
FIG. 14 illustrates a cross-sectional view of a further modified example of a three-dimensional semiconductor device according to an example embodiment.

In an example embodiment, pad regions of the gate electrodes GE disposed on the connection region IA may be formed to have a same thickness as a thickness of the gate electrodes GE disposed on a memory cell array region MA. However, an example embodiment is not limited thereto. For example, pad regions Pw in FIG. 6 may be transformed into pad regions Pw' having an increased thickness, greater than that of gate electrodes GE_w, as illustrated in FIG. 12. Thus, the pad regions Pw illustrated in FIGS. 10 and 11 may be transformed into pad regions Pw' having an increased thickness, as illustrated in FIGS. 13 and 14, respectively.

Figure 15:
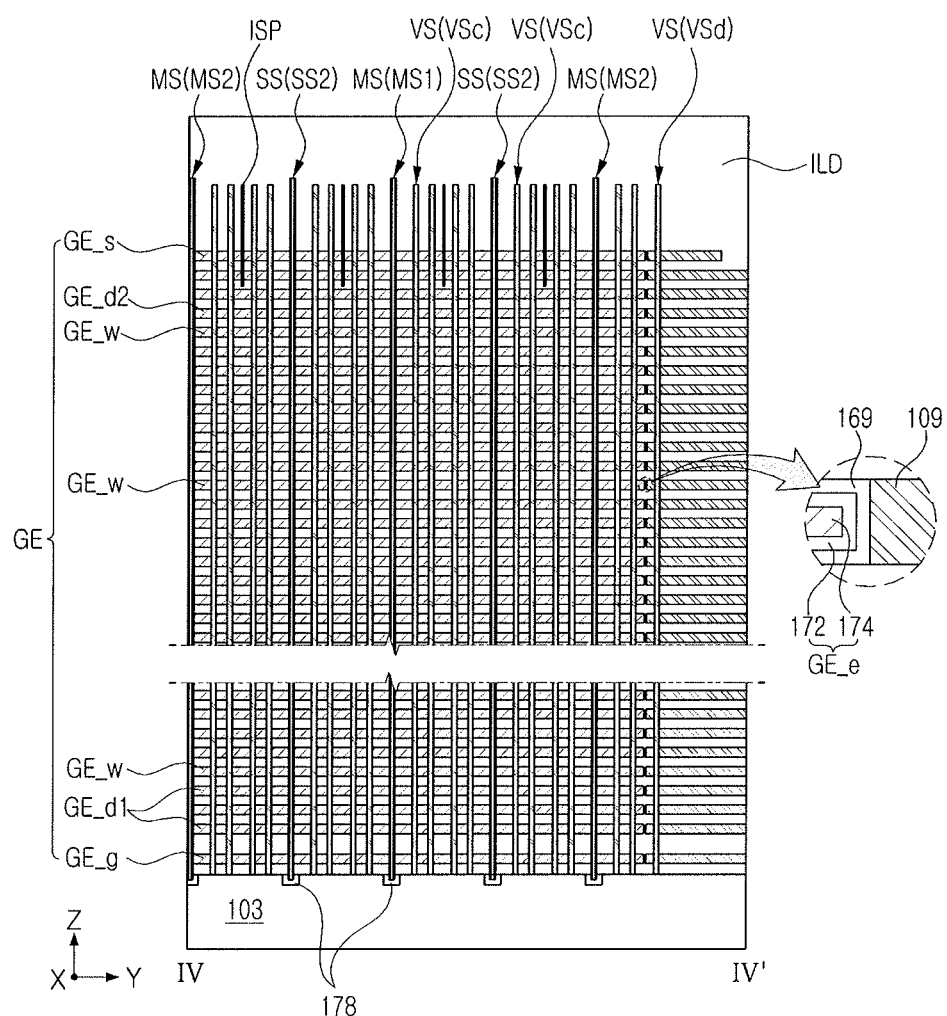
FIG. 15 illustrates a cross-sectional view of an example of a three-dimensional semiconductor device according to an example embodiment.

Subsequently, an example of a dummy region DA illustrated in FIG. 3 will be described with reference to FIG. 15. FIG. 15 is a cross-sectional view of a region taken along line IV-IV' of FIG. 4A.

With reference to FIGS. 4A and 15, a second main separation structure MS2 among main separation structures MS may be disposed adjacent to a dummy region DA. Edge electrodes GE_e disposed on the same level as gate electrodes GE and electrically floated may be disposed on a substrate 103 of the dummy region DA. The edge electrodes GE_e may be formed using the same material as the gate electrodes GE, such as the first conductive material 172 and the second conductive material 174.

Sacrificial layers 109 opposing the edge electrodes GE_e may be disposed on the substrate 103 of the dummy region DA. The sacrificial layers 109 may be thicker than the edge electrodes GE_e. The second gate dielectric 169 may be interposed between the sacrificial layers 109 and the edge electrodes GE_e and may be extended to an upper surface/a lower surface of the edge electrodes GE_e. The sacrificial layers 109 may be formed, e.g., using a silicon nitride.

An insulating material layer (ILD) interposed between the sacrificial layers 109, between the gate electrodes GE, and between the edge electrodes GE_e and covering the gate electrodes GE and the sacrificial layers 109 may be disposed. The insulating material layer (ILD) may be formed using a material different from the sacrificial layers 109, e.g., a silicon oxide.

In an example embodiment, vertical dummy structures VSd penetrating through the edge electrodes GE_e and the sacrificial layers 109 may be disposed. The vertical dummy structures VSd may have a structure the same as that of vertical structures VS described with reference to FIG. 8.

Subsequently, an example of a method of forming a three-dimensional semiconductor device according to an example embodiment will be described with reference to FIGS. 16A to 20B. In FIGS. 16A to 20B, FIGS. 16A, 17A, 18A, 19A, and 20A are cross-sectional views of regions taken along line I-I' of FIG. 4A. FIGS. 16B, 17B, 18B, 19B, and 20B are cross-sectional views of regions taken along line II-II' of FIG. 4A.

Figure 16A:
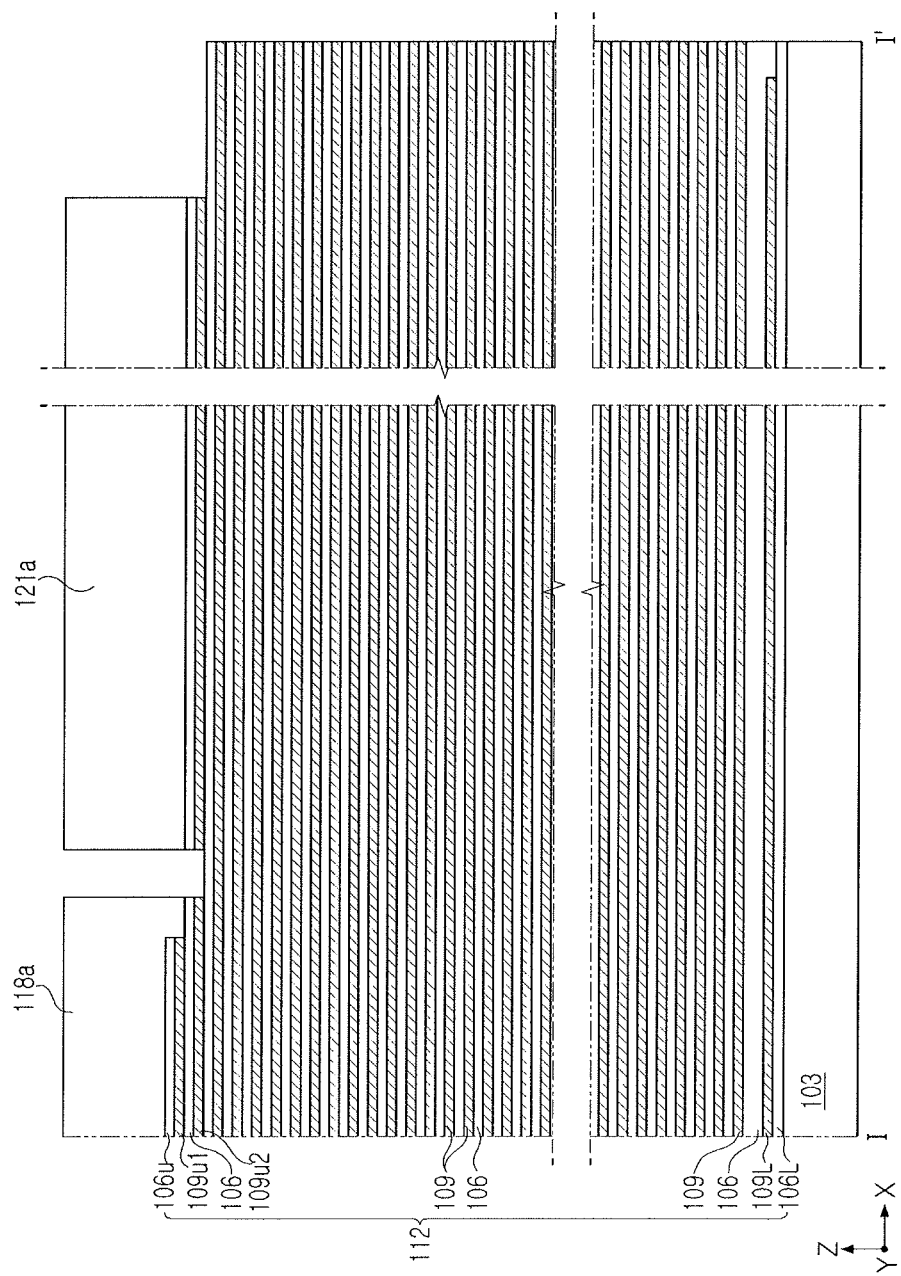
FIGS. 16A to 20B illustrate cross-sectional views of stages in a method of forming a three-dimensional semiconductor device according to an example embodiment.
Figure 16B:
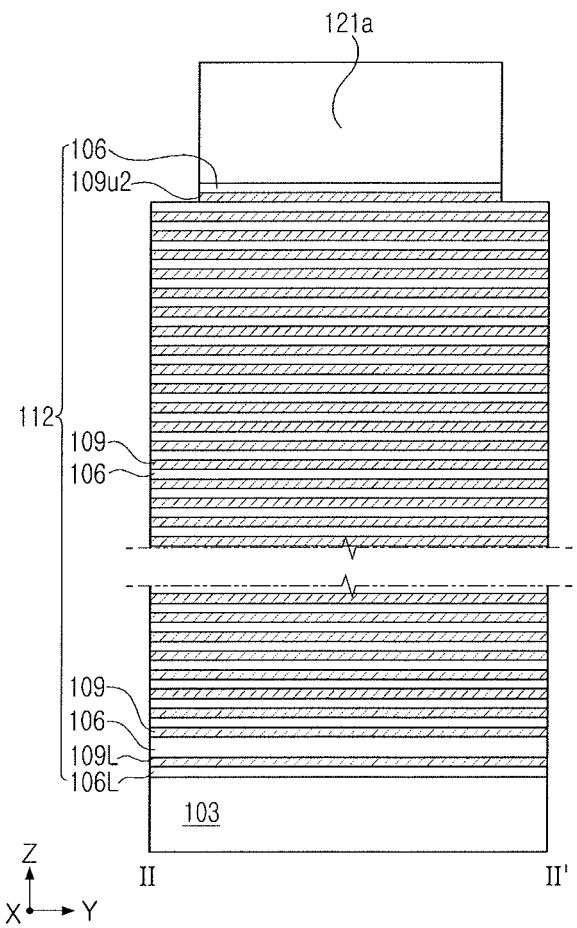

With reference to FIGS. 4A, 16A, and 16B, a mold structure 112 including sacrificial layers 109L, 109, 109u1, and 109u2 and interlayer insulating layers 106L, 106, and 106u may be formed on the surface 103s of the substrate 103 including the memory cell array region MC and the connection region IA. The interlayer insulating layers 106L, 106, and 106u may be formed using, e.g., a silicon oxide, while the sacrificial layers 109L, 109, 109u1, and 109u2 may be formed using, e.g., a silicon nitride.

The sacrificial layers 109L, 109, 109u1, and 109u2 may be disposed on a lowermost sacrificial layer 109L and may include intermediate sacrificial layers 109 sequentially stacked and disposed to be spaced apart from each other, as well as a second uppermost sacrificial layer 109u2 and an uppermost sacrificial layer 109u1, sequentially disposed on the intermediate sacrificial layers 109. The intermediate sacrificial layers 109 may be formed after the lowermost sacrificial layer 109L is patterned.

The interlayer insulating layers 106L, 106, and 106u may include a lowermost interlayer insulating layer 106L disposed between the substrate 103 and the lowermost sacrificial layer 109L, an uppermost interlayer insulating layer 106u disposed on the uppermost sacrificial layer 109u1, and intermediate interlayer insulating layers 106 disposed between the lowermost interlayer insulating layer 106L and the uppermost interlayer insulating layer 106u and between the sacrificial layers 109. The uppermost sacrificial layer 109u1 and the uppermost interlayer insulating layer 106u may be patterned.

A first mask pattern 118a and a second mask pattern 121a disposed to be spaced apart from each other may be formed on the substrate 103 including the interlayer insulating layers 106L, 106, and 106u and the sacrificial layers 109L, 109, 109u1, and 109u2.

In an example embodiment, the first mask pattern 118a may cover an entirety of a memory cell array region MA and may be extended to a portion of the connection region IA. The second mask pattern 121a may be formed on a portion of the connection region IA. A single second mask pattern 121a may be formed to have a quadrangular shape on a single memory block BLK among memory blocks BLK. The first mask pattern 118a and the second mask pattern 121a may be formed to have photoresist patterns.

A single interlayer insulating layer and a single sacrificial layer not overlapping the first mask pattern 118a and the second mask pattern 121a among the interlayer insulating layers 106L, 106, and 106u and the sacrificial layers 109L, 109, 109u1, and 109u2 may be etched sequentially using the first mask pattern 118a and the second mask pattern 121a as an etching mask.

Figure 17A:
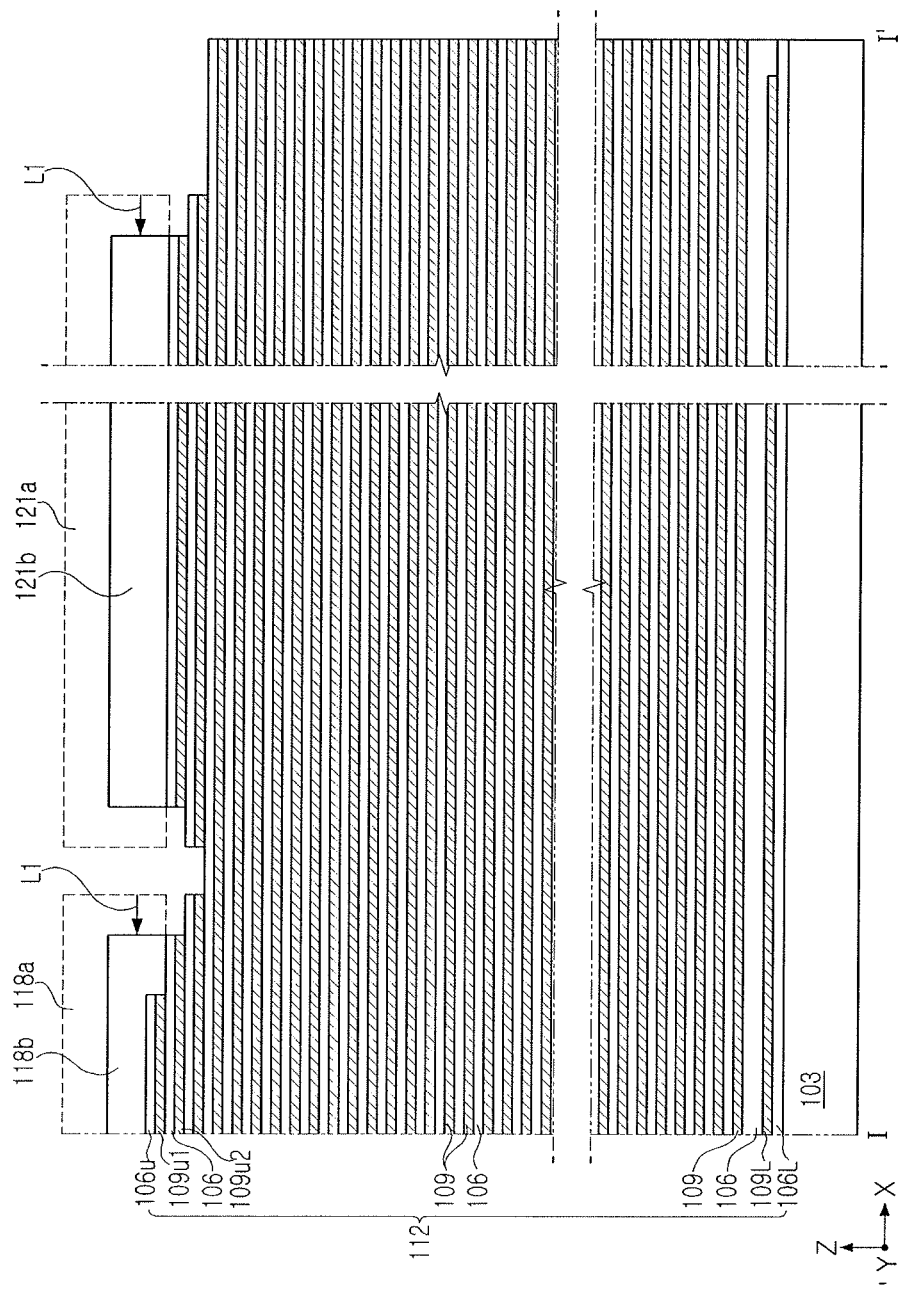
Figure 17B:
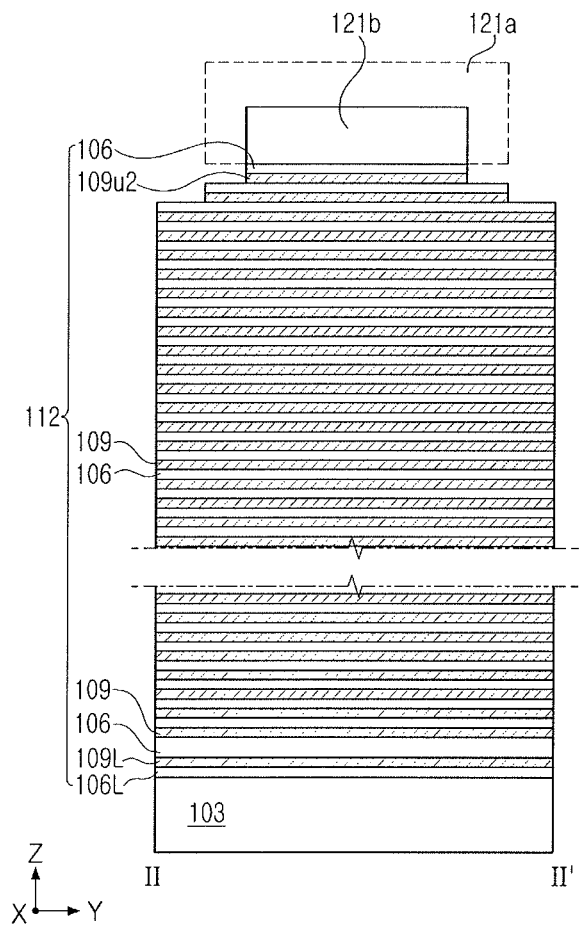

With reference to FIGS. 4A, 17A, and 17B, a first trimming process reducing sizes of the first mask pattern and the second mask pattern (118a and 121a of FIGS. 16A and 16B) may be performed. The first trimming process may be provided as a partial etching process reducing the first mask pattern and the second mask pattern (118a and 121a of FIGS. 16A and 16B) by a first length L1 in a direction parallel to a surface of the substrate 103 to form minimized mask patterns 118b and 121b, respectively. In other words, referring to FIG. 17A, the first and second mask patterns 118a and 121a (dashed lines in FIG. 17A) may be reduced to minimized mask patterns 118b and 121b, respectively (solid lines in FIG. 17A).

Thus, a single interlayer insulating layer and a single sacrificial layer not overlapping the minimized mask patterns 118b and 121b among the interlayer insulating layers 106L, 106, and 106u and the sacrificial layers 109L, 109, 109u1, and 109u2 may be etched sequentially using the minimized mask patterns 118b and 121b, sizes of which have been reduced by the first trimming process.

Figure 18A:
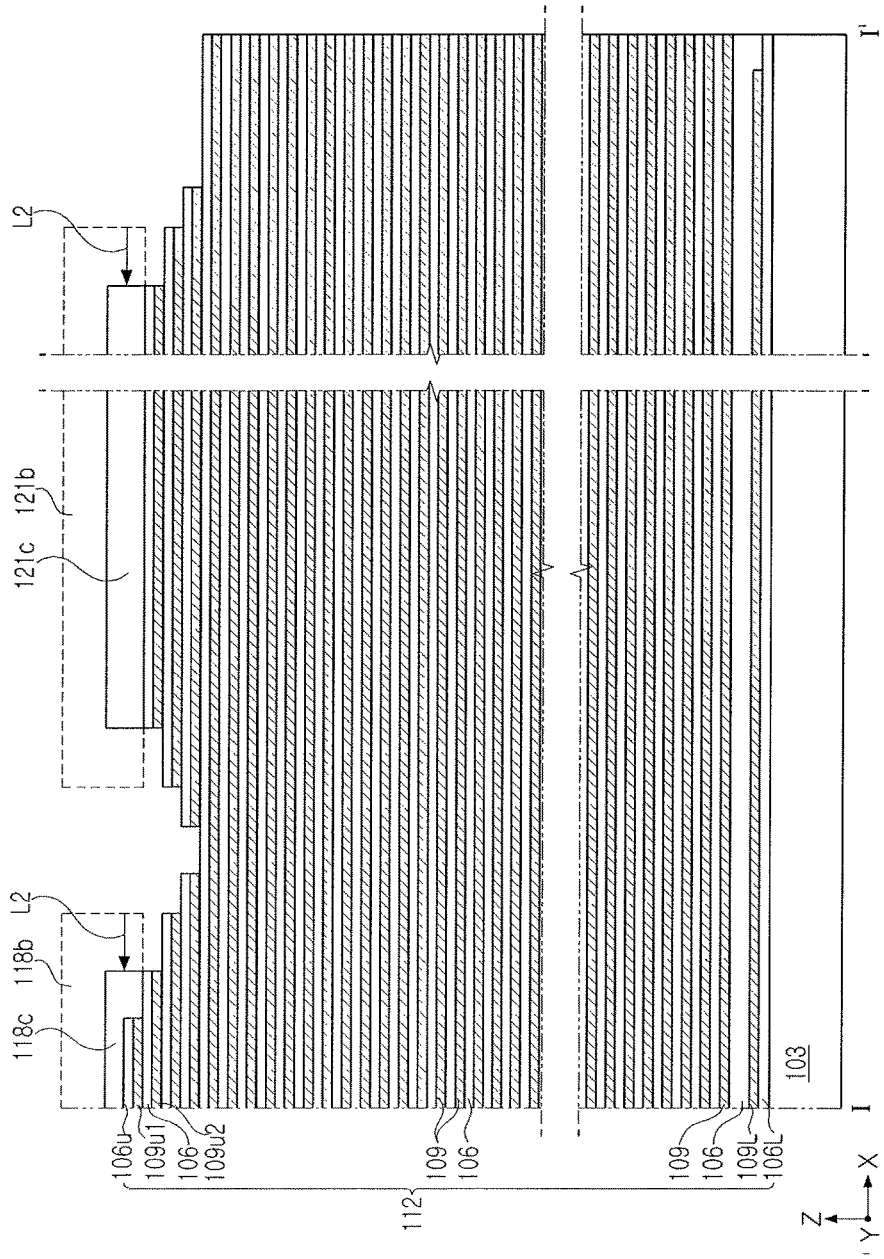
Figure 18B:
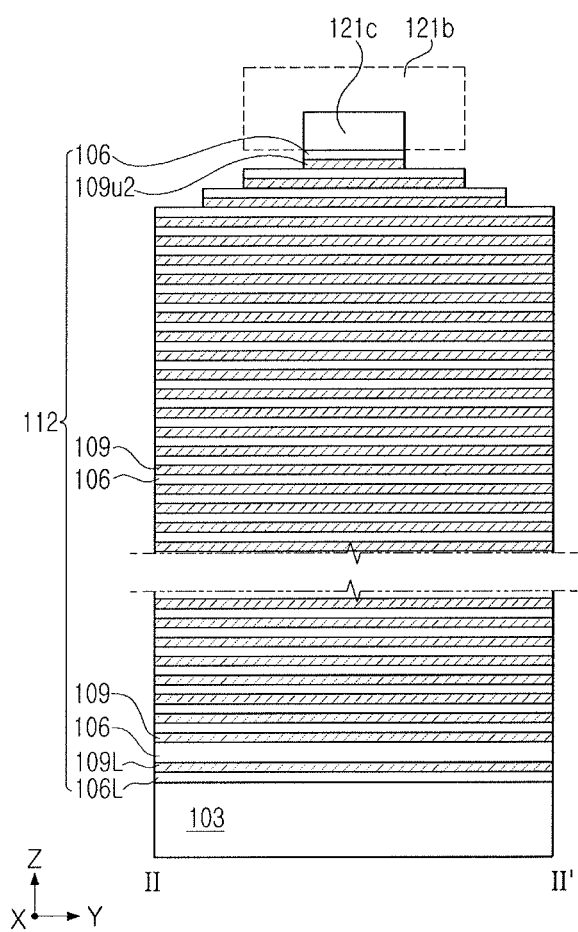

With reference to FIGS. 4A, 18A, and 18B, a second trimming process further reducing the sizes of the minimized mask patterns 118b and 121b (of FIGS. 17A and 17B) may be performed. The second trimming process may be provided as a partial etching process reducing the minimized mask pattern (118b and 121b of FIGS. 16A and 16B) by a second length L2 in the direction parallel to the surface of the substrate 103 to form m asks 118c and 121c. The second length L2 may be greater than the first length L1 illustrated in FIGS. 17A and 17B.

Thus, a single interlayer insulating layer and a single sacrificial layer not overlapping mask patterns 118c and 121c among the interlayer insulating layers 106L, 106, and 106u and the sacrificial layers 109L, 109, 109u1, and 109u2 may be sequentially etched using the mask patterns 118c and 121c, sizes of which have reduced by the second trimming process.

Figure 19A:
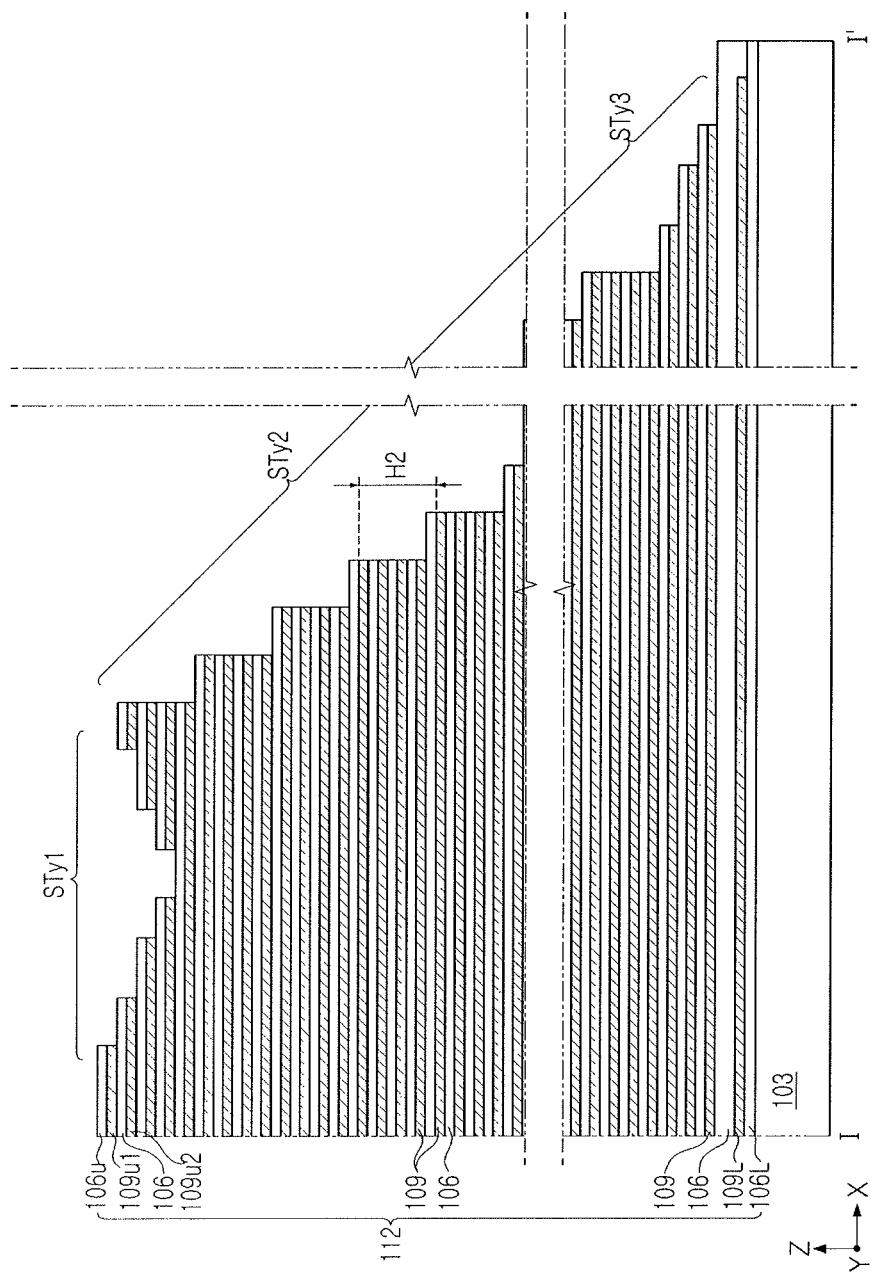
Figure 19B:
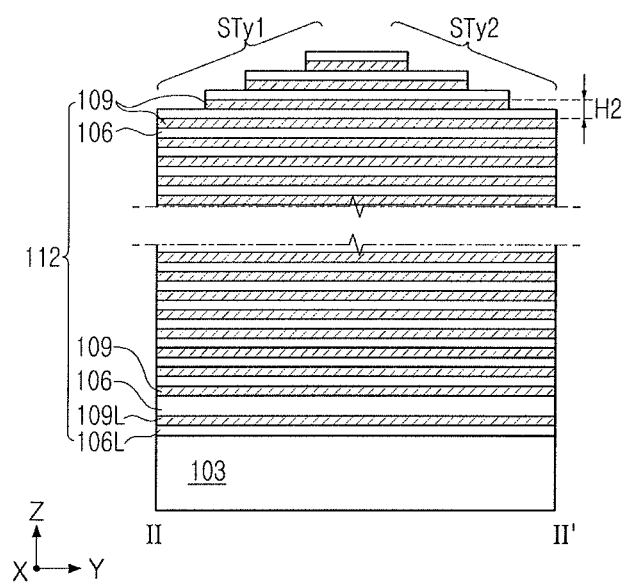

With reference to FIGS. 4A, 19A, and 19B, after the mask patterns 118c and 121c (of FIGS. 18A and 18B) are removed, a step process of forming steps lowered by a uniform height H1 in a region in which the mask pattern 121c has been removed may be performed. Thus, steps STx2 lowered by the first step portion H1 in the first direction X, steps STx1 and STx3 lowered by the second step portion H2, lower than the first step portion H1, in the first direction X, and steps Sty1 and Sty2 lowered by the second step portion H2, in the second direction Y, perpendicular to the first direction X.

Figure 20A:
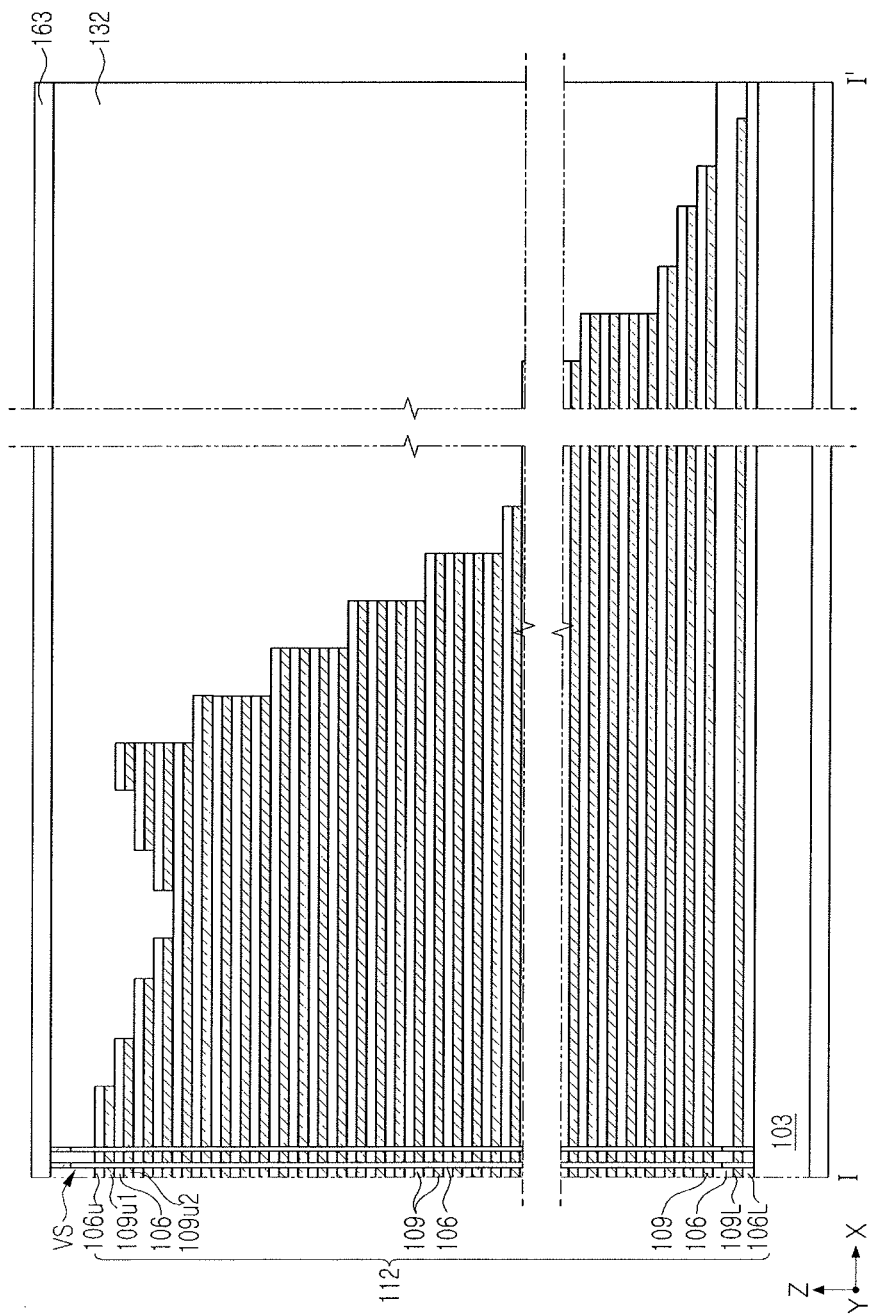
Figure 20B:
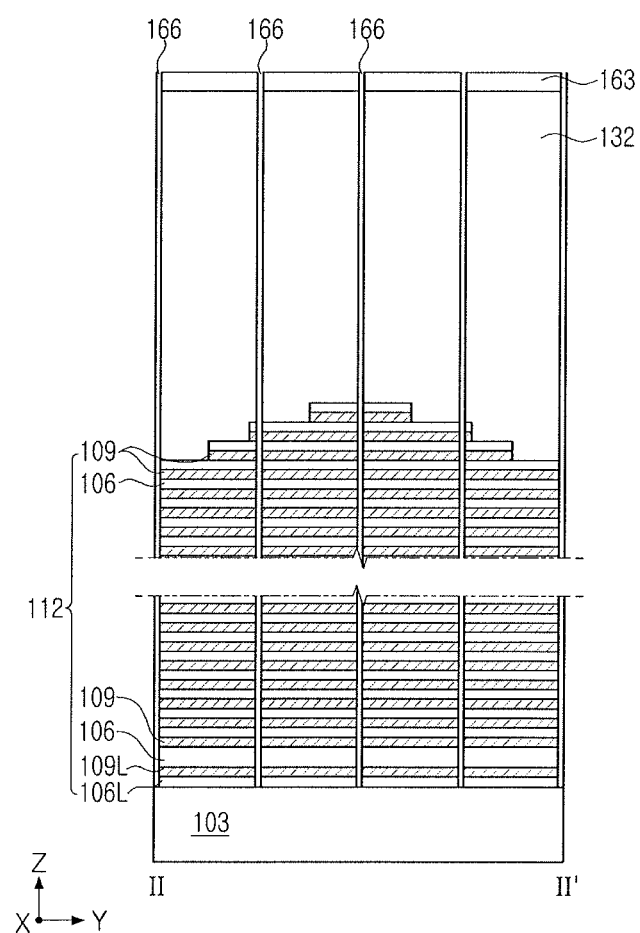

With reference to FIGS. 4A, 20A and 20B, a first capping insulating layer 132 may be formed on the mold structure 112. An insulating separation pattern (ISP of FIG. 5B) penetrating through the first capping insulating layer 132, as well as the uppermost sacrificial layer 109u1 and a second uppermost sacrificial layer 109u2 of the mold structure 112 may be formed.

Vertical structures VS penetrating through the first capping insulating layer 132 and the mold structure 112 may be formed. The vertical structures VS may be formed to have a structure the same as that described with reference to FIG. 8. A second capping insulating layer 163 covering the first capping insulating layer 132 and the vertical structures VS may be formed.

Trenches 166 penetrating through the first capping insulating layer 132, the second capping insulating layer 163, and the mold structure 112 may be formed. The sacrificial layers 109L, 109, 109u1, and 109u2 of the mold structure 112 may be exposed by sidewalls of the trenches 166.

With reference to FIGS. 4A, 5A, 5B, and 5C, a gate replacement process in which the sacrificial layers (109L, 109, 109u1, and 109u2 of FIGS. 20A and 20B) exposed by the trenches (166 of FIGS. 20A and 20B) are replaced by gates may be performed. For example, the sacrificial layers (109L, 109, 109u1, and 109u2 of FIGS. 20A and 20B) exposed by the trenches (166 of FIGS. 20A and 20B) may be removed, thereby forming empty spaces, a second gate dielectric 169 covering an internal wall of the empty spaces may be formed, and gate electrodes GE filling the empty spaces, the internal walls of which are covered by the second gate dielectric 169 may be formed.

Subsequently, insulating spacers 176 may be formed on side surfaces of the trenches (166 of FIGS. 20A and 20B), impurity regions 178 may be formed in the substrate 103 below the trenches (166 of FIGS. 20A and 20B), and conductive patterns 180 filling the trenches (166 of FIGS. 20A and 20B) may be formed. The insulating spacers 176 and the conductive patterns 180 may form separation structures MS and SS.

Subsequently, after an insulating material covering the separation structures MS and SS and the second capping insulating layer (163 of FIGS. 20A and 20B) is formed, a process of forming a contact and a wiring may be performed. The insulating material covering the interlayer insulating layers (106L, 106, and 106u of FIGS. 20A and 20B), the first capping insulating layer and the second capping insulating layer (132 and 163 of FIGS. 20A and 20B), and the second capping insulating layer (163 of FIGS. 20A and 20B) may be formed using the same material, thereby forming an insulating material layer (ILD).

As described above, gate electrodes may include pad regions arrayed in three dimensions. The pad regions arrayed in three dimensions may improve a degree of integration in a semiconductor device.

According to example embodiments, sizes of pad regions, among the pad regions arrayed in three dimensions, may be changed, thereby forming the semiconductor device without a defect and improving the degree of integration in the semiconductor device. For example, as illustrated in FIG. 20B, an area of an exposed surface of the sacrificial layers 109 exposed by the trenches 166 may be great, thereby performing the gate replacement process of replacing the sacrificial layers 109 with a gate material, without a defect.

By way of summation and review, according to example embodiments, a semiconductor device including gate electrodes in which pad regions arrayed in three dimensions for a high degree of integration therein are provided. That is, the pad regions may include first pad regions sequentially arrayed in a first direction from the memory cell array region toward the connection region and second pad regions sequentially arrayed in a second direction perpendicular to the first direction and lowered by a height different, e.g., lower, than that of the first pad regions. The second pad regions may be formed by a gate replacement process without defects by forming a single pad region, among pad regions sequentially arrayed in the second direction, having a relatively long length.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A three-dimensional semiconductor device, comprising:
   gate electrodes including pad regions sequentially lowered by a first step portion in a first direction and sequentially lowered by a second step portion in a second direction perpendicular to the first direction, the second step portion being lower than the first step portion,
   wherein a length of a single pad region among pad regions sequentially lowered by the second step portion in the second direction is less than a length of a remainder of the pad regions in the second direction,
   wherein a pad region of the pad regions adjacent to the single pad region in the second direction is separated into a pad portion and a dummy portion adjacent to each other in the second direction, the pad portion and the dummy portion including at least one same material,
   wherein a length in the second direction of the pad portion is greater than a length in the second direction of the dummy portion, and
   wherein the pad portion is spaced apart from the dummy portion.

2. The three-dimensional semiconductor device as claimed in claim 1,
   wherein the gate electrodes include a first gate electrode having a first pad region, a second gate electrode having a second pad region, a third gate electrode having a third pad region, and a fourth gate electrode having a fourth pad region,
   wherein the first pad region, the second pad region, the third pad region, and the fourth pad region are arrayed to have a stepped shape sequentially lowered by the second step portion in the second direction, and
   wherein a length of the third pad region is less than a length of a single pad region among the first pad region, the second pad region, and the fourth pad region in the second direction.

3. A three-dimensional semiconductor device, comprising:
   a first main separation structure and a second main separation structure in a memory cell array region and in a connection region of a substrate;
   a first secondary separation structure between the first main separation structure and the second main separation structure; and
   gate electrodes stacked in the memory cell array region in a direction perpendicular to a surface of the substrate and extended to the connection region, the gate electrodes being between the first main separation structure and the second main separation structure,
   wherein the gate electrodes include pad regions sequentially lowered by a first step portion in a first direction oriented from the memory cell array region toward the connection region, and sequentially lowered by a second step portion in a second direction oriented from the first main separation structure to the second main separation structure, the second step portion being lower than the first step portion,
   wherein contact plugs are positioned on the pad regions, pad regions sequentially lowered by the second step portion in the second direction including a single pad region,
   wherein the first secondary separation structure divides the single pad region into a pad portion and a dummy portion,
   wherein the contact plugs include a single contact plug on the single pad region, and wherein the single contact plug is in contact with the pad portion and is spaced apart from the dummy portion.

4. The three-dimensional semiconductor device as claimed in claim 3, further comprising one or more upper gate electrodes on the gate electrodes,
wherein the one or more upper gate electrodes are provided in plural, and the upper gate electrodes provided in plural include a plurality of upper pad regions sequentially lowered in the first direction and disposed on a same level in the second direction, and
wherein a length in the first direction of a single upper pad region among the plurality of upper pad regions is greater than a length in the first direction of each of pad regions of the gate electrodes.

5. The three-dimensional semiconductor device as claimed in claim 3, further comprising one or more lower gate electrodes under the gate electrodes,
wherein the one or more lower gate electrodes are disposed in plural,
wherein a lowermost lower gate electrode among the one or more lower gate electrodes provided in plural includes a lower select pad region, and
wherein a length in the first direction of the lower select pad region is greater than a length in the first direction of the pad regions of the gate electrodes,
wherein the one or more lower gate electrodes provided in plural include a plurality of lower electrodes on the lowermost lower gate electrode,
wherein the plurality of lower electrodes include lower pad regions sequentially lowered by the second step portion in the first direction, and
wherein a length in the first direction of a single lower pad region among the lower pad regions of the plurality of lower electrodes is different from a length in the first direction of a remainder of the lower pad regions sequentially lowered by the second step portion in the first direction.

6. The three-dimensional semiconductor device as claimed in claim 3, further comprising a second secondary separation structure between the first main separation structure and the second main separation structure,
wherein the first secondary separation structure is in the connection region, and
wherein the second secondary separation structure is on the memory cell array region, and extended to a portion of the connection region, and
wherein the second secondary separation structure has an end portion opposing an end portion of the first secondary separation structure.

7. The three-dimensional semiconductor device as claimed in claim 6, wherein:
the pad regions include a first pad region, a second pad region, a third pad region, and a fourth pad region, sequentially lowered by the second step portion in the second direction, and
wherein a length in the second direction of the third pad region is less than a length in the second direction of each of the first pad region, the second pad region, and the fourth pad region, and
wherein the contact plugs include a first contact plug on the first pad region, a second contact plug on the second pad region, a third contact plug on the third pad region, and a fourth contact plug on the fourth pad region,
wherein the second pad region is the single pad region,
wherein the second contact plug is the single contact plug, and wherein at least a portion of the dummy portion is between the pad portion and the third contact plug.

8. The three-dimensional semiconductor device as claimed in claim 7, wherein:
the first secondary separation structure intersects the second pad region and divides the second pad region into the pad portion and the dummy portion,
each of the gate electrodes includes a first conductive material and a second conductive material, different from each other, and
the pad portion and the dummy portion are formed of the first conductive material and the second conductive material.

9. The three-dimensional semiconductor device as claimed in claim 7, wherein;
the first secondary separation structure intersects the second pad region and divides the second pad region into the pad portion and the dummy portion,
each of the gate electrodes includes a first conductive material and a second conductive material, different from each other,
the pad portion and the dummy portion commonly include the first conductive material, and
the pad portion includes a larger amount of the second conductive material than the dummy portion.

10. The three-dimensional semiconductor device as claimed in claim 6, further comprising a gate dielectric covering a lower surface and an upper surface of each of the gate electrodes and covering a single side surface of each of the gate electrodes, the first secondary separation structure allows a portion of the gate dielectric to be separated.

11. The three-dimensional semiconductor device as claimed in claim 3, further comprising:
edge gate electrodes opposing the gate electrodes; and
sacrificial layers opposing the edge gate electrodes and thicker than the edge gate electrodes, the edge gate electrodes being between the sacrificial layers and the second main separation structure,
wherein the second main separation structure is disposed between the gate electrodes and the edge gate electrodes.

12. A three-dimensional semiconductor device, comprising: gate electrodes including intermediate pad regions lowered by a first step portion in a first direction and lowered by a second step portion in a second direction perpendicular to the first direction, the second step portion being lower than the first step portion,
wherein pad regions sequentially lowered by the second step portion in the second direction include upper pad region, lower pad region and intermediate pad regions between the upper pad region and the lower pad region, and
wherein a length in the second direction of at least one of the intermediate pad regions is different from a length in the second direction of at least one of the upper pad region and the lower pad region.

13. The three-dimensional semiconductor device as claimed in claim 3, wherein the length in the second direction of the single pad region is greater than a length in the second direction of at least one of a remainder of the pad regions sequentially lowered by the second step portion in the second direction.

14. The three-dimensional semiconductor device as claimed in claim 3,
wherein the pad portion is spaced apart from dummy portion, wherein a length in the first direction of the pad portion is the same as a length in the first direction of the dummy portion, and wherein a length in the second direction of the pad portion is greater than a length in the second direction of the dummy portion.

15. The three-dimensional semiconductor device as claimed in claim 3, wherein the gate electrodes include a single gate electrode, wherein the single gate electrode includes a gate region, the pad portion and the dummy portion, wherein the pad portion and the dummy portion extend from the gate region of the single gate electrode, and wherein a thickness of each of the pad portion and the dummy portion is greater than a thickness of the gate region of the single gate electrode.

16. The three-dimensional semiconductor device as claimed in claim 12, wherein the intermediate pad regions include a first intermediate pad region and a second intermediate pad region, wherein the length in the second direction of the first intermediate pad regions is greater than the length in the second direction of the at least one of the upper pad region and the lower pad region, and wherein the length in the second direction of the second intermediate pad regions is smaller than the length in the second direction of the at least one of the upper pad region and the lower pad region.

17. The three-dimensional semiconductor device as claimed in claim 12, wherein the intermediate pad regions include a first intermediate pad region and a second intermediate pad region, wherein the upper pad region, the first intermediate pad region, the second intermediate pad region, and the lower pad region are arrayed to have a stepped shape sequentially lowered by the second step portion in the second direction, wherein the length in the second direction of the first intermediate pad region is greater than the length in the second direction of the second intermediate pad region, wherein a length in the second direction of the first intermediate pad region is greater than the length in the second direction of the at least one of the upper pad region and the lower pad region, and wherein a length in the second direction of the second intermediate pad region is smaller than the length in the second direction of the at least one of the upper pad region and the lower pad region.

18. The three-dimensional semiconductor device as claimed in claim 12, further comprising a separation structure; and contact plugs on the pad regions, wherein the intermediate pad regions include a first intermediate pad region and a second intermediate pad region, wherein the gate electrodes include a single gate electrode, wherein the single gate electrode includes a gate region and the first intermediate pad region, wherein the contact plugs include an upper contact plug on the upper pad region, a first intermediate contact plug on the first intermediate pad region, a second intermediate contact plug on the second intermediate pad region, and a lower contact plug on the lower pad region, wherein the separation structure divides the first intermediate pad region into a pad portion and a dummy portion, and wherein the first intermediate contact plug is in contact with the pad portion and is spaced apart from the dummy portion.

19. The three-dimensional semiconductor device as claimed in claim 18, wherein the upper pad region, the first intermediate pad region, the second intermediate pad region, and the lower pad region are arrayed to have a stepped shape sequentially lowered by the second step portion in the second direction, and wherein at least a portion of the dummy portion is between the pad portion and the second intermediate contact plug.

20. The three-dimensional semiconductor device as claimed in claim 1, further comprising a contact plug on the pad region, wherein the contact plug is in contact with the pad portion and is spaced apart from the dummy portion.

* * * * *